United States Patent [19]

Mochida

[11] Patent Number: 6,101,136
[45] Date of Patent: Aug. 8, 2000

[54] SIGNAL DELAY DEVICE FOR USE IN SEMICONDUCTOR STORAGE DEVICE FOR IMPROVED BURST MODE OPERATION

[75] Inventor: Yoshifumi Mochida, Tokyo, Japan

[73] Assignee: NEC Corporation, Tokyo, Japan

[21] Appl. No.: 09/226,049

[22] Filed: Jan. 4, 1999

[30] Foreign Application Priority Data

Jan. 13, 1998 [JP] Japan .................................. 10-005054

[51] Int. Cl.[7] .............................. G11C 7/00; G11C 8/00
[52] U.S. Cl. ............................................ 365/194; 365/236
[58] Field of Search ............................. 365/194, 230.03, 365/230.06, 233, 236

[56] References Cited

U.S. PATENT DOCUMENTS

| | | | |
|---|---|---|---|
| 5,715,211 | 2/1998 | Toda | 365/233 |
| 5,764,584 | 6/1998 | Fukiage et al. | 365/230.03 |
| 5,895,482 | 4/1999 | Toda | 365/233 |
| 5,991,226 | 11/1999 | Bhullar | 365/233 |

*Primary Examiner*—Trong Phan
*Attorney, Agent, or Firm*—Darryl G. Walker

[57] ABSTRACT

A semiconductor storage device (100) having a burst mode capability for accomplishing a rapid pipeline operation is disclosed. A signal delay device (104), such as a first-in-first-out buffer (FIFO), is disposed between the data read circuitry of a memory cell array (102) and an output buffer (106). The signal delay device (104) is composed of a plurality of storage circuits (206-0 and 206-1) connected in parallel. Data values are input to selected of the storage circuits (206-0 and 206-1) by input control signals (DSEL0–DSEL1) and output from selected of the storage circuits (206-0 and 206-1) by output control signals (OSEL0–OSEL1). The DSEL0–DSEL1 and OSEL0–OSEL1 signals are generated in response to count signals (OCNT0–OCNT1).

30 Claims, 10 Drawing Sheets

SIGNAL DELAY DEVICE FOR USE IN SEMICONDUCTOR STORAGE DEVICE FOR IMPROVED BURST MODE OPERATION

TECHNICAL FIELD

The present invention relates generally to a signal delay circuits, and more particularly to a delay circuit incorporated into the output path of a storage device having a burst mode of operation.

BACKGROUND OF THE INVENTION

In recent years, advances in design approaches and manufacturing processes has led to central processing units (CPUs) of increased speeds. At the same time, the speeds of the most common form of main system storage, dynamic random access memory (DRAM), have increased at a much slower rate. As a result, DRAMs may not always be capable of providing read data to, or receiving write data from, a CPU at a fast enough rate. One way to address the speed differences in CPUs and slower memory devices (such as DRAMs), is to utilize a cache memory.

A cache memory is typically considerably smaller than main memory, but can operate at a much faster speed. Cache memories can be a portion of a single CPU integrated circuit (chip), or be a separate device having an external connection to a CPU. A typical cache memory will hold a copy of a portion of the data stored within the main memory, to allow rapid access thereto. The copy is usually arranged into pages, each of which occupy a contiguous range of addresses.

In the operation of a typical system that employs a cache memory, the CPU will routinely make read accesses to the cache memory. If the desired data is present within the cache memory, the data are used by the CPU. If the desired data are not present within the CPU, the desired data are copied anew (in page form) from the main memory into the cache memory. Furthermore, in the event a page of data is altered within a cache memory, the page may have to written back into the main memory. Thus, the overall system speed can depend upon the rate at which data can be written from the main memory into the cache memory. Accordingly, it is desirable for the devices that form a main memory to be capable of high-speed transfers of data strings, consisting of continuous address values, to and from a cache memory.

A preferred method of passing data between a main memory and a cache memory is that of "burst transfer." In a burst transfer, an initial (base) address within the main memory is specified, and then the data string is output (or input in the case of a write operation) in synchronism with a reference clock. The length of the data string is referred to as a "burst length." One example of a type of memory that is capable of providing burst transfers is a synchronous DRAM (SDRAM). SDRAMs operate in synchronism with a reference clock, latching addresses and providing data accesses in synchronism with the reference clock.

Burst transfers are preferred in SDRAMs because such transfers can provide faster overall data throughput than other DRAM approaches. For example, one type of general use (i.e., non-synchronous) DRAM is the "fast page mode" DRAM. Fast page mode DRAMs receive an address, and in response thereto, provide output data. The time between the application of the address and the presence of data at the output of the fast page mode DRAM is often referred to as the "address access time." High-speed fast page mode DRAMs can have an address access time of 20 nanoseconds (ns) (an operating speed of 50 MHz).

In the case of burst SDRAMs, the access of an initial set of data is accomplished in the same general fashion as a general use DRAM. As a result, when accessing a single set of data (the data resulting from one address), SDRAMs provide no significant speed advantages over general use DRAMs. However, once a SDRAM has accessed an initial set of data, each subsequent data set in a particular address order can be accessed at a faster speed than a general use DRAM. This is accomplished by simultaneously processing multiple sets of data within the burst SDRAM, so that consecutive sets of data can be input or output at a higher sustained rate. As a result, the frequency at which data can be input to or output from a burst SDRAM can be 100 MHz or higher. This sustained rate is referred to as the "burst transfer frequency." Maximum access speeds are achieved by running the reference clock of a SDRAM at the maximum burst transfer frequency.

While burst accesses can provide faster speeds for a sequential group of data sets, as noted above, accesses to an initial data set (i.e., the first data set in a burst sequence) provide no significant speed advantages over general use DRAM accesses. As a result, when a command input is applied to a burst SDRAM on one reference clock period, a number of clock periods will go by before the data set will be available at the output of the SDRAM. The number of clock periods between the application of a command input and the presence of output data is often referred to as "CAS latency." The term CAS latency is used, as it is usually a column address strobe (CAS) signal that is used to initiate a data access operation.

SDRAMs are typically capable of providing a programmable CAS latency. That is, while an SDRAM may have a minimum CAS latency, the CAS latency can be increased or decreased by one or more reference clock periods, if desired. CAS latency values, as well as various other operating parameters, are conventionally set by applying one or more predetermined commands to a "mode register" within the SDRAM.

One reason programmable CAS latencies exist, is to accommodate a range of operating speeds. Within a SDRAM, the time required to generate an internal address following the activation of a CAS signal can be considered an address access time. The address access time represents the speed at which decoder and related circuits within the SDRAM operate, and can be independent of the reference clock signal. As a result, variations in the reference clock frequency may require changes in the CAS latency in order to ensure the most efficient operation of the SDRAM. For example, some buses may not be capable of operating at the maximum burst transfer frequency. In such a case, the reference clock for the SDRAM will be relatively slow. Minimum address access times may fall within one reference clock period. However, in the event the reference clock is running at the maximum burst transfer frequency, the minimum address access time may be greater than two or more clock periods. Consequently, the SDRAM CAS latency may have to be increased.

A number of approaches have been developed to allow SDRAMs to be capable of operating in a burst mode. Two common approaches are "pipeline" systems and "prefetch" systems. Pipeline systems typically include a series of circuit stages, each of which functions in synchronism with the reference clock. In this manner, address information and data are shifted along the various circuit stages, eventually resulting in data being output on consecutive reference clock cycles from an output stage. Prefetch systems initially "prefetch" multiple data sets in an essentially parallel fashion. The multiple data sets are then subsequently output in a serial fashion on consecutive reference clock cycles.

Referring now to FIG. 13, a timing diagram is set forth illustrating read operations in a conventional pipeline system. The timing diagram sets forth two consecutive burst read operations, each having a burst length and CAS latency of four. The pipeline system includes four stages; a first stage that receives an applied address (ADD), and generates a sequence of internal addresses representing consecutive addresses in a burst (YADD); a second stage that predecodes the internal addresses to generate predecoded addresses (PYADD); a third stage, that applies the predecoded addresses to an array within the SDRAM, resulting in input/output signals (IOBUS) being driven on an input/output (IO) bus internal to the SDRAM; and a fourth stage, that drives data signals (DQ) on a system data bus external to the SDRAM.

The first read access begins with the application of a first base address (AaO) in synchronism with an active read command (Read) at time T1. In the particular example of FIG. 13, the read command is generated by a combination of four signals, including a row address strobe signal (/RAS), a column address strobe signal (/CAS), a write enable signal (/WE), and a chip select signal (/CS).

Between times T1 and T2, the applied address is processed by the first stage resulting in the generation of an internal base address (YADD=Aa0).

Between times T2 and T3, the predecoder produces a predecoded base address (PYADD=Aa0). At about the same time, the first stage generates a second burst address (YADD=Aa1) of the four address burst sequence.

Between times T3 and T4, the third stage results in the data set corresponding to the base address Aa0 being output on internal IO lines (IOBUS=Da0). At the same general time, the second stage predecoder produces a second predecoded burst address (PYADD=Aa1), and the first stage generates an internal third burst address (YADD=Aa2).

Between times T4 and T5, the fourth stage results in a base output data set being driven on the data pins of the SDRAM (DQ=Aa0). The last internal burst address is generated by the first stage (YADD=Aa3), a third predecoded address is generated by the second stage (PYADD=Aa2), and the third stage results in a second data set being placed on the IO lines (IOBUS=Da1).

In this fashion, applied address information is processed in a pipelined fashion, so that multiple addresses or data sets are passed through the device, but never present at the same stage. By controlling each stage in synchronism with the reference clock, address/data collisions are avoided, and data sets are output in synchronism with the reference clock.

Referring now to FIG. 14, a timing diagram is set forth illustrating read operations in a conventional prefetch system. The timing diagram sets forth two consecutive prefetch read operations, each having a burst length of four, a CAS latency of three, and a prefetch number of two. The prefetch system receives an applied address (ADD), and in response thereto, generates internal address pairs (YADD), equal to the prefetch number (two, in this particular case). The internal addresses are then essentially processed in parallel. In response to the internal addresses, two predecoded addresses are generated (PYADD(E)) and (PYADD(O)) in parallel. The parallel predecoded addresses result in corresponding output data sets being placed on parallel IO Buses (IOBUS(E) and IOBUS(O)). Thus, a prefetch circuit includes parallel address and/or data processing circuits allowing multiple access operations to occur in parallel.

Finally, having accessed multiple data sets in parallel, the parallel data sets are then output sequentially at SDRAM output pins (DQ).

The first read access of FIG. 14 begins with the application of a first base address (Aa0) with an active read command (Read) at time T1. In the particular example of FIG. 14, read commands are generated in the same fashion as described in conjunction with FIG. 13.

Between times T1 and T2, the applied first base address (Aa0) is processed to generate internal address pair Aa0/Aa1. This address pair (Aa0/Aa1) is then processed in parallel to generate parallel predecoded addresses at about time T2 (PYADD(E)=Aa0 and PYADD(O)=Aa1).

Between times T2 and T3, the parallel predecoded addresses result in output data sets on parallel IO buses (IOBUS(E)=Da0 and IOBUS(O)=Da1). The parallel data sets are then output in an essentially serial fashion, with data set Da0 being available at time T4 and data set Da1 being available at time T5.

In this fashion, in response to applied address information, a prefetch system will TV access data sets in parallel. The parallel data sets will then be output in a serial fashion in synchronism with the reference clock.

While the pipeline and prefetch architectures described above can provide memory devices with increased burst transfer frequencies, it is still desirable to achieve even faster burst transfer frequencies.

In a pipeline system, burst transfer frequencies can be maximized by increasing the number of stages within the device. At the same time, the amount of processing done by each stage should also be reduced, as the slowest stage will determine the maximum speed of the pipeline system. Unfortunately, it can be difficult to reduce the processing done by stages any further. In addition, an increase in the number of stages can result in undesirable increases in the size of circuits used to connect the various stages. Consequently, the number of stages can have a practical limit of three to four.

In a prefetch system, burst transfer frequencies can be increased by increasing the number of address/data sets that are processed in parallel. Such an approach results in an increase in the number of parallel stages. This can increase the peripheral area of the device, which is undesirable, as it is a common design goal to manufacture devices with as small a chip size as possible. A further drawback to processing larger numbers of address/data sets is that accesses to a smaller number of data sets are not possible. Thus, as the size of parallel accesses increases, the degree of freedom with which a system accesses the memory is reduced. This can adversely impact system performance. For these reasons, the degree of parallel processing is generally limited to two or three.

In light of the increasing speeds of CPUs and other system devices, it would be desirable arrive at some way of overcoming the system limitations described above, and thereby provide faster burst transfer frequencies in a storage device.

SUMMARY OF THE INVENTION

According to the disclosed embodiments, a semiconductor storage device provides high-speed burst mode readouts of data sets. The data sets are temporarily stored within a signal delay device until the data sets can be output to an output buffer which operates in a synchronous fashion.

According to one aspect of the embodiments, the signal delay device includes a number of data registers connected in parallel. Data values are input to a data register according to an input control signal, and output from a data register according to an output control signal. The input control signals and output control signals are generated in response to the output of a common signal generator circuit.

According to another aspect of the embodiments, the data registers include a first transfer gate coupled to an input terminal, the first transfer gate being controlled by an input control signal. The output of the first transfer gate is connected to the input of a first inverter, and the output of the first inverter is connected to both the input of a second inverter and the input of a second transfer gate. The output of the second inverter is connected to the output of the first transfer gate. The second transfer gate is coupled to an output terminal.

According to another aspect of the embodiments, the data registers include a flip-flop circuit with the input connected to an input terminal, and the control clock input that receives an input control signal. The flip-flop circuit retaining a value from the input terminal in synchronism with the input control signal. The data registers further include a second transfer gate having an input connected to the output terminal of the flip-flop circuit. The second transfer gates are controlled by output control signals.

According to another aspect of the embodiments, a signal generator circuit includes a counter for generating a count value, and a decoder for decoding the count value into count signals.

According to another aspect of the embodiments, the signal generator circuit outputs a count value in binary form. The binary count value is decoded into input control signals and output control signals.

According to another aspect of the embodiments, a signal delay device includes two data registers. A count value is decoded by an input inverter that receives an input control signal and an output inverter that receives an output control signal. One register receives the input and output control signal, while the other register receives an inverted input control signal and inverted output control signal.

According to another aspect of the embodiments, a signal delay device storage register is controlled by an input control signal and an output control signal, there being a predetermined time period between the activation of the input control signal and the activation of the output control signal.

According to another aspect of the embodiments, the predetermined time period between the activation of the input and output control signals of the same register is accomplished by generating the input and output control signals from different decoded outputs of a counter.

According to another aspect of the embodiments, structures are provided for selecting the duration of the time period between the activation of input control signals and the activation of output control signals.

According to another aspect of the embodiments, the structure that enables the selection of the time period duration includes a number of switch networks. The switch networks allow different decoded clock outputs to be used to generate the input and output control signals. By activating different switch networks, different time period durations can be selected.

According to another aspect of the embodiments, a semiconductor storage device includes a reading circuit for reading stored data in response to external input signals and a signal delay device having a number of storage registers arranged in parallel. Data from the read circuit is stored within selected storage registers according to input control signals, and output from the storage registers according to output control signals. The semiconductor storage device further includes a counter that provides a count signal in response to a reference clock, an input control section that generates the input control signals in response to the count signal, and an output control section that generates the output control signals in response to the count signal. The input and output control sections operate in response to different edges of a reference clock to process a given set of data from the reading circuit. In this way, the reading circuit can be constructed as a pipeline system where the multiple processing steps are accomplished in response to the same system clock cycle.

According to another aspect of the embodiments, the registers within the signal delay device can be controlled by mutually different input and output control signals, or alternatively, controlled by common input and output control signals.

According to another aspect of the embodiments, the semiconductor storage device further includes an output buffer connected to the signal delay device. The output buffer outputs data received from the signal delay device on a given clock edge of a reference clock. For a given set of data, the reading circuit operates in response to a different reference clock edge than the output buffer.

According to another aspect of the embodiments, a predetermined number of reference clock periods passes between the activation of the read circuit and the activation of the output buffer for a given set of data. The signal delay device includes a number of registers equal to the predetermined number.

According to another aspect of the embodiments, the semiconductor storage device includes a decoding arrangement between the signal delay device and the input control section, or between the signal delay device and the output control section. The decoding arrangement decodes counter values output from the counter.

According to another aspect of the embodiments, the semiconductor storage device includes a counter having a number of states equal to the number of registers within the signal delay device. The state of the counter changes in response to a reference clock and is output as a number of count signals. The input control section includes a number of count delay circuits that delay the count signals. Latch circuits within the input control section receive the delayed count signals, and latch them in response to a read clock signal to generate the input control signals. The output control section uses the count signals to generate the output control signals.

According to another aspect of the embodiments, the semiconductor storage device includes a counter having a number of states equal to the number of registers within the signal delay device. The state of the counter changes in response to a reference clock and is output as one count signal. The input control section includes a count delay circuit that delays the count signal, and an inverter that inverts the count signal. A latch circuit receives the delayed, inverted count signal, and latches it in response to a read clock signal to generate an input control signal. The output control section uses the count signal to generate an output control signal.

According to another aspect of the embodiments, the semiconductor storage device includes a counter having a number of states equal to the number of registers within the signal delay device. The state of the counter changes in response to a reference clock and is output as a number of count signals. The input control section includes a number of count delay circuits that delay the count signals. Latch circuits within the input control section receive the delayed count signals, and latch them in response to a read clock signal to generate the input control signals. In addition, switch circuits are situated between the latch circuits and delay circuits. The switch circuits determine which delayed count signals are coupled to which latch circuit. The output control section uses the count signals to generate the output control signals.

According to another aspect of the embodiments, the semiconductor storage device includes a read clock generator that generates a read clock signal in response to a reference clock. The semiconductor storage device further includes a logical product circuit that takes the logical product of the read clock and an enable signal to provide an indication of the duration of the read period. This indication is applied to a counter circuit to generate count signals during the read period. The output control signal uses the logical product of the count signals and the enable signal to generate the output control signals. As a result, the input and output control signals only operate during the read period.

DETAILED DESCRIPTION OF THE EMBODIMENTS

Various detailed embodiments of the present invention will now be described in conjunction with a number of block diagrams and timing diagrams.

Figure 1:
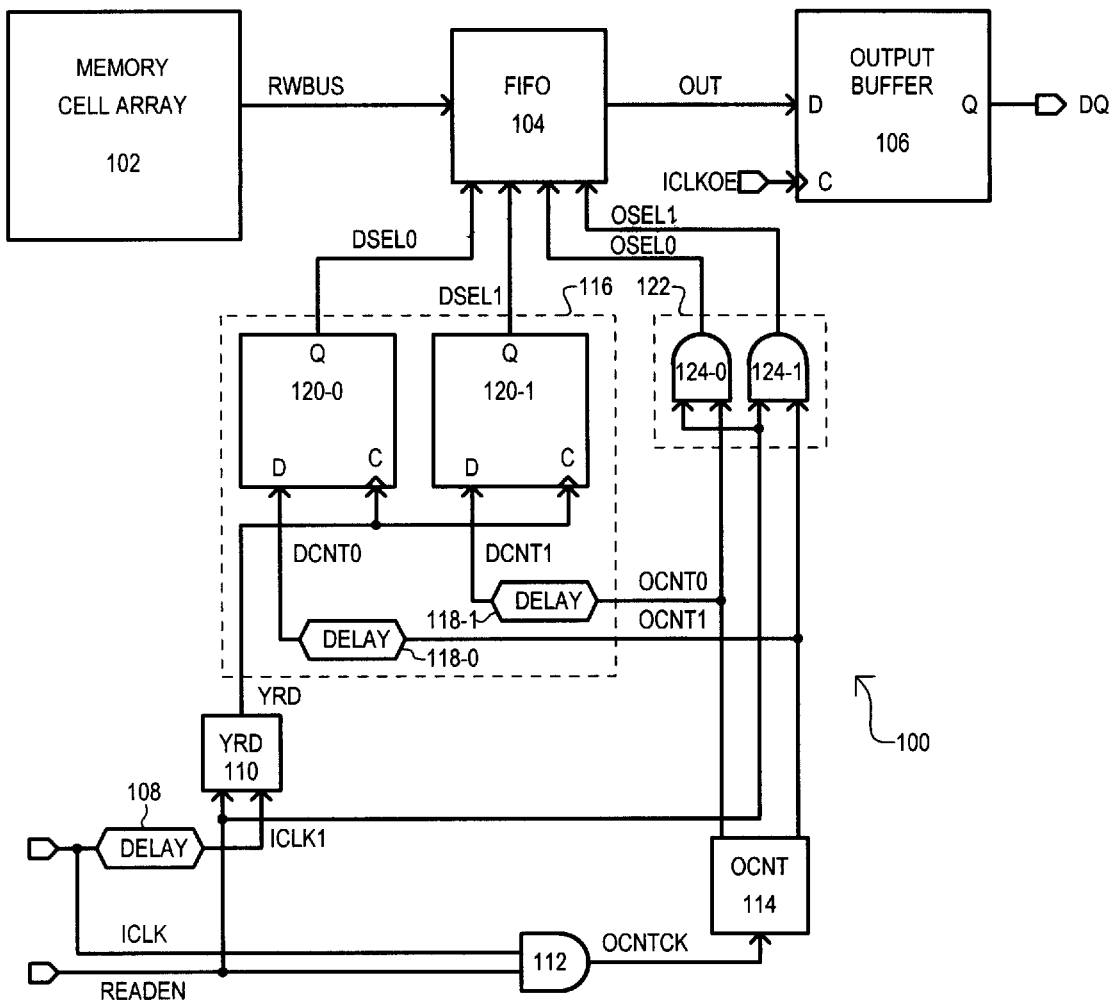
FIG. 1 is a block diagram of a semiconductor storage device showing a first embodiment of the present invention.
Figure 2:
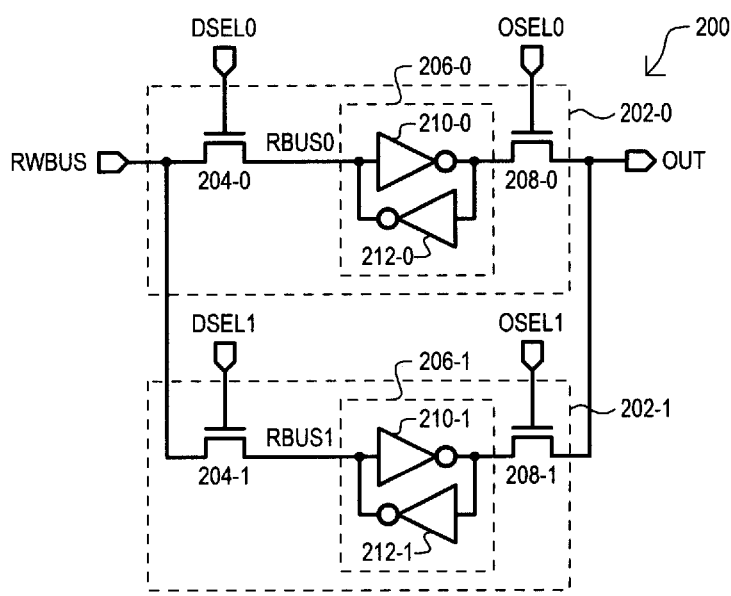
FIG. 2 is a schematic diagram illustrating a first-in-first-out buffer (FIFO) that may be used in the semiconductor storage device of FIG. 1.
Figure 3:
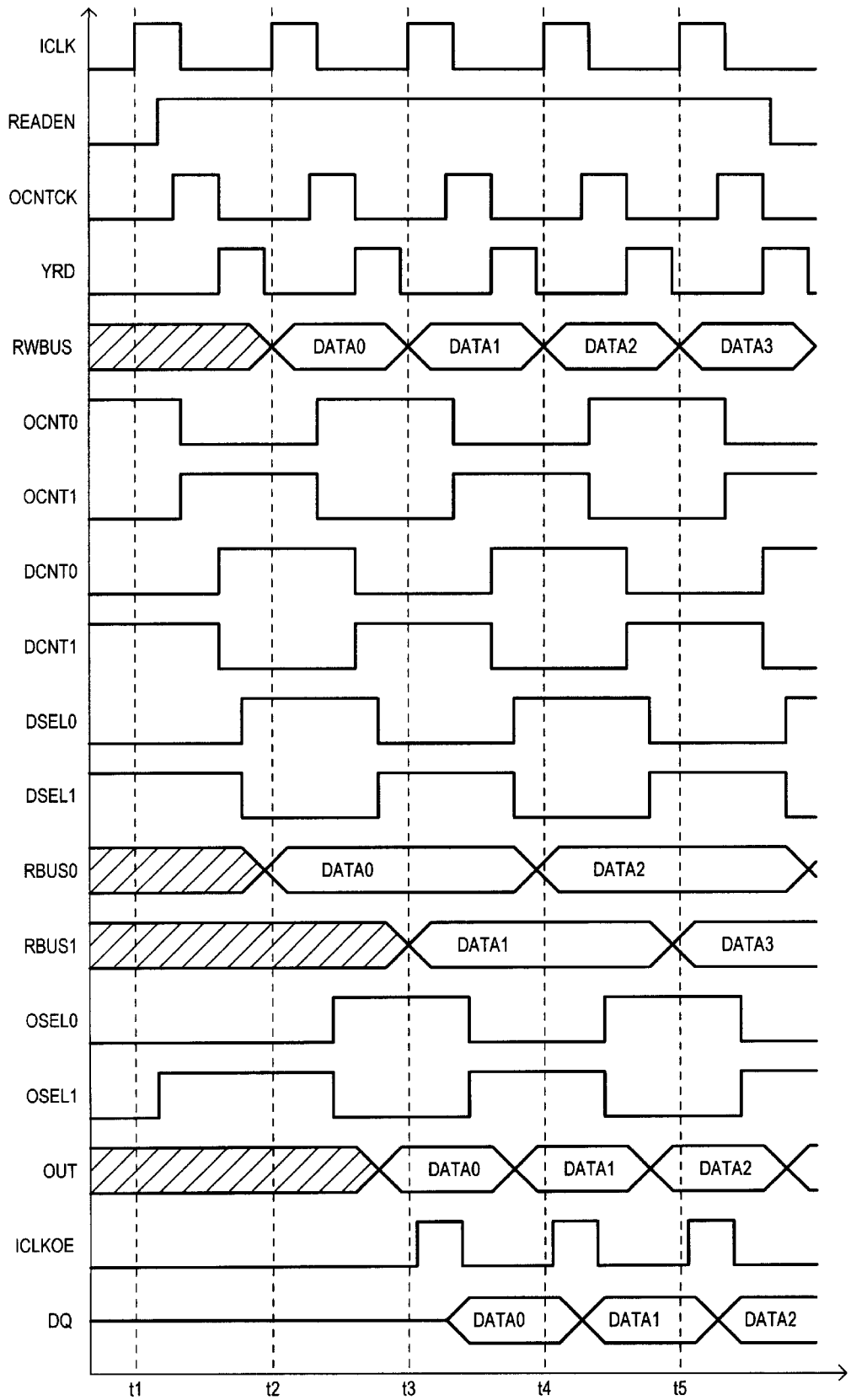
FIG. 3 is a timing diagram illustrating the operation of the semiconductor storage device of FIG. 1.

Referring now to FIGS. 1 to 3, a first embodiment will be described. FIG. 1 is a block diagram of semiconductor storage device according to the first embodiment. FIG. 2 is a schematic diagram of signal delay device that may be used in the first embodiment of FIG. 1. In the particular arrangement of the first embodiment, the signal delay device is a first-in-first-out buffer (FIFO). FIG. 3 is a timing diagram illustrating the operation of the first embodiment.

In the description of the first embodiment that follows, it is assumed that the storage device has a column address strobe (CAS) latency of three and burst length of four. Of course, these values can be programmable, and should not be construed as limiting the first embodiment or any other embodiments thereto.

Referring now to FIG. 1, the first embodiment is designated by the general reference character 100, and is shown to include a memory cell array 102. The memory cell array 102 is composed of memory cells disposed in the form of a matrix having rows and columns. The memory cells of the same column are connected to at least one digit line. In response to an internal column address signal, a column address decoder (not shown) will select a set of digit lines. Data from memory cells connected to the selected digit lines will be amplified by sense amplifiers (not shown) within the memory cell array 102. The amplified data will then be output on a read/write bus (RWBUS).

The RWBUS is coupled to a signal delay device 104. The signal delay device 104 is coupled by a data bus (OUT) to an output buffer 106. The output buffer 106 provides output data on external connections (DQ). The external connections may be output pins of an integrated circuit, as just one example.

The first embodiment provides improvements in access time by processing address information and data in an asynchronous fashion prior to the signal delay device 104. That is, from the application of a read command to the presence of output data on the RWBUS, processing is performed asynchronously to an internal synchronous clock (ICLK). (The ICLK signal is synchronous with the reference clock signal which is used for system timing.) At the same time, the output buffer 106 provides output data in synchronism with the ICLK signal. Data collisions between the asynchronously output data of memory cell array 102 and the synchronous data provided by the output buffer 106 are resolved by the signal delay device 104.

As noted above, in the first embodiment 100, the signal delay device 104 is a FIFO. An example of a FIFO that may be used as the signal delay device 104 is set forth in FIG. 2, and designated by the general reference character 200. The FIFO receives input data sets on the RWBUS, and outputs them, in a first-in-first-out fashion on the OUT bus.

In the arrangement of FIG. 1, the FIFO need only be able to retain a number of data sets equal to the CAS latency minus one. Therefore, because the first embodiment will described as having a CAS latency of three, the FIFO has a total depth of two (i.e., can store a maximum of two data sets at any time). Such a FIFO depth helps to ensure that data will be output in a continuous fashion when multiple data sets are accessed.

Accordingly, the FIFO 200 set forth in FIG. 2 is shown to include a first register 202-0 and a second register 202-1. The two registers (202-0 and 202-1) are used in a cyclical fashion, essentially synchronous with the ICLK signal. Thus, accesses would occur to the first register 202-0, then the second register 202-1, then the first register 202-0, and so on.

Each register (202-0 and 202-1) is shown to include a first transfer gate (204-0 and 204-1), a storage circuit (206-0 and 206-1), and a second transfer gate (208-0 and 208-1). The first transfer gates (204-0 and 204-1) couple data on the RWBUS to their respective storage circuits (206-0 and 206-1). The second transfer gates (208-0 and 208-1) couple data from their respective storage circuits (206-0 and 206-1) to the OUT bus (and on toward an output buffer).

In the particular arrangement of FIG. 2, the first transfer gates (204-0 and 204-1) include n-channel insulated gate field effect transistors (IGFETs), having source-drain paths disposed between the RWBUS and the storage circuits (206-0 and 206-1). First transfer gate 204-0 is controlled by a first FIFO input control signal (DSEL0), by having the DSEL0 signal coupled to the gate of its n-channel transistor. Similarly, first transfer gate 204-1 is controlled by a second FIFO input control signal (DSEL1), by having the DSEL1 signal coupled to the gate of its n-channel transistor.

The storage circuits (206-0 and 206-1) of the particular FIFO 200 of FIG. 2 are shown to be latches formed by pairs of cross-coupled inverters. Thus, each storage circuit (206-0 and 206-1) includes a first inverter (210-0 and 210-1) and a second inverter (212-0 and 212-1). Each first inverter (210-0 and 210-1) has an input coupled to its respective first transfer gate (204-0 and 204-1) and an output coupled to its respective second transfer gate (208-0 and 208-1). Conversely, each second inverter (212-0 and 212-1) has an input coupled to its respective second transfer gate (208-0 and 208-1) and an output coupled to its respective first transfer gate (204-0 and 204-1).

In the particular arrangement of FIG. 2, the second transfer gates (208-0 and 208-1) are similar to the first transfer gates (204-0 and 204-1), each including an n-channel IGFET. Each n-channel IGFET has a source-drain path disposed between its respective storage circuit (206-0 and 206-1) and the OUT bus. Second transfer gate 208-0 is controlled by a first FIFO output control signal (OSEL0) by having the OSEL0 signal applied to the gate of its n-channel transistor. Second transfer gate 208-1 is controlled by a second FIFO output control signal (OSEL1) that is applied to the gate of its n-channel transistor.

In the preferred embodiment FIFO 200, the FIFO input control signals (DSEL0 and DSEL1) function so that either first transfer gate 204-0 or first transfer gate 204-1 is selected at any one time, to thereby latch data from the RWBUS. Similarly, the FIFO output control signals (OSEL0 and OSEL1) function so that either second transfer gate 208-0 or second transfer gate 208-1 is selected at any one time to output data onto the OUT bus.

Thus, as set forth in FIG. 2, the preferred FIFO signal delay circuit includes registers (202-0 and 202-1) arranged in parallel between the RWBUS and OUT bus. It is understood that the FIFO 200 arrangement illustrated in FIG. 2 illustrates the FIFO processing of a single bit of a data set, and that one such FIFO 200 exists for each bit of data set. RWBUS connection to the FIFO 200 in FIG. 2, can also be considered an input terminal to the FIFO 200. Similarly, the OUT bus connection to the FIFO 200 can be considered an output terminal.

The preferred FIFO arrangement, of having parallel registers, provides advantages over conventional FIFO structures. A conventional FIFO structure typically includes a number of latch circuits arranged in series. Such a conventional approach can be unsuitable for use in a storage device, such as that set forth in FIG. 1. As will be recalled, programmable CAS latencies are a desirable feature in storage devices. However, in the event a conventional FIFO is used, changes in CAS latency will result, not only in a change in the number of stages used, but will also require a more complex control arrangement for serially passing the data through the registers. For example, if a conventional FIFO included the series arrangement of four registers, but was being used for a CAS latency of three, the time required to pass data through the FIFO would be longer than the preferred FIFO, as only two registers would be used, and data would have to pass through the remaining two registers in order to be output. This is in contrast to the preferred embodiment FIFO 200, where an increase in the CAS latency does not require an increase in the number of series stages. In this manner, the preferred FIFO 200 can provide faster speeds, and greater flexibility than conventional FIFOs.

Referring back to FIG. 1, the first embodiment 100 is shown to further include a delay circuit 108. The delay circuit 108 receives an internal clock signal ICLK. The ICLK signal is generated from, and is synchronous with, a reference clock signal (not shown) applied from an external source to the preferred embodiment 100. The delay circuit 108 introduces a delay into the ICLK signal to generate a delayed internal clock signal ICLK1. In the particular arrangement of FIG. 1, the delay introduced by the delay circuit 108 corresponds to the time required to output a data set from the memory cell array 102 onto the RWBUS.

The first embodiment 100 further includes a read synchronizing signal generator 110. The read synchronizing signal generator 110 receives the ICLK1 signal and a read enable signal READEN, and provides a read synchronous signal YRD. The read synchronizing signal generator 110 generates an active YRD signal when both the READEN signal and the ICLK1 signal are both active (high).

The ICLK signal and READEN signal are further applied to logic gate 112. The logic gate 112 generates a countup signal OCNTCK that is the logical product of the ICLK and READEN signals. In the particular arrangement of FIG. 1, the logic gate 112 is a two-input AND gate.

The ONTCK signal is applied to a counter 114, which generates a count number that cyclically counts to a number equal to the number of register stages in the signal delay device 104. Thus, because the first embodiment 100 has a signal delay device 104 with two stages, it will cyclically count from "0" to "1," and then begin counting once again, from "0" to "1." In the arrangement of FIG. 1, the count generated by the counter 114 is decoded by the counter into a number of count signals equal to the number of register stages (two, in this case). Thus, two count signals (OCNT0 and OCNT1) are output from the counter 114, with only one count signal being activated (going high) at a given time. In this manner, a count value of 0 is decoded into the OCNT0 signal being high and the OCNT1 signal being low. A count value of 1 is decoded into the OCNT0 signal being low and the OCNT1 signal being high. Of course, the count cycle could begin with a count value of either 0 or 1.

The input to the signal delay device 104 is controlled by an input control section 116. Accordingly, data output onto the RWBUS by the memory cell array 102 are latched into the signal delay device 104 according to input control signals generated by the input control section 116. Because the preferred signal delay device 104 of FIG. 1 is a FIFO, the input control section 116 can be conceptualized as being a "FIFO" input control section 116. In this arrangement, the input control section 116 will generate an input control signal corresponding to each stage within the FIFO. Thus, only the register activated by an input control signal will latch input data.

The input control section 116 of the preferred embodiment 100 is shown to include two count delay circuits, 118-0 and 118-1. Count delay circuit 118-0 delays the OCNT1 signal by a predetermined amount of time to generate one input controlling count signal DCNT0. Similarly, count delay circuit 118-1 delays the OCNT0 signal by a predetermined amount of time to generate another input controlling count signal DCNT1.

The input control section 116 further includes latch circuits, 120-0 and 120-1, for generating the input control signals utilized to latch data into the signal delay device 104. In particular, latch circuit 120-0 latches the DCNT0 signal in response to the rising edge of the YRD signal, to thereby generate a first input control signal DSEL0. Latch circuit 120-1 latches the DCNT1 signal in response to the rising edge of the YRD signal, to thereby generate a second input control signal DSEL1. The DSEL0 and DSEL1 signals are applied to the signal delay device 104 to latch data that is output onto the RWBUS.

When the signal delay device 104 is a FIFO, the DSEL0 and DSEL1 signals are applied to the FIFO as set forth in FIG. 2.

The output of data from the signal delay device 104 is controlled by an output control section 122. Accordingly, data is placed onto the OUT bus by the signal delay device 104 in response to output control signals generated by the output control section 122. Because the preferred signal delay device 104 of FIG. 1 is a FIFO, the output control section 122 can be conceptualized as being a "FIFO" output control section 122. In this arrangement, the output control section 122 will generate an output control signal corresponding to each stage within the FIFO. Thus, only the register activated by an output control signal will provide output data onto the OUT bus.

The output control section 122 of the first embodiment 100 includes a number of output control logic gates, one logic gate corresponding to each count signal. Thus, in the particular arrangement of FIG. 1, the output control section 122 includes two output control logic gates, 124-0 and 124-1, that receive the count signals OCNT0 or OCNT1, respectively. In addition, both of the output control logic gates (124-0 and 124-1) receive the READEN signal as an input. In the first embodiment 100, the output control logic gates (124-0 and 124-1) are AND gates. Thus, output control logic gate 124-0 provides an output control signal OSEL0 that is the logical product of the OCNT0 and READEN signals, and output control logic gate 124-1 provides an output control signal OSEL1 that is the logical product of the OCNT1 and READEN signals. The OSEL0 and OSEL1 signals are applied to the signal delay device 104 to provide data to the OUT bus from the signal delay device 104.

When the signal delay device 104 is a FIFO, the OSEL0 and OSEL1 signals are applied to the FIFO as set forth in FIG. 2.

Data placed on the OUT bus by the signal delay device 104 is output by the output buffer 106 in response to an output synchronous signal ICLKOE. The ICLKOE signal is generated to be synchronous with the ICLK signal. In the first embodiment 100, the ICLKOE signal is generated by taking the logical product of the ICLK signal and the READEN signal delayed by a predetermined delay period.

It is understood that the particular clocking arrangement for output buffer 106 set forth in FIG. 1 should not be construed as limiting to the present invention. As just one example, while the preferred embodiment 100 uses a signal (ICLKOE) that is dedicated to the output buffer 106, the ICLK signal could be used to control the output buffer 106.

Having described the constituent parts of a particular first embodiment 100 in detail, the operation of the first embodiment 100 will now be described.

A read operation for the preferred embodiment 100 will be initiated by the application of conventional synchronous dynamic random access memory (SDRAM) input signals. Thus, a column buffer circuit (not shown) will receive an externally applied address signal at the same time a read command is applied. The address will thus represent the base address of a burst sequence of addresses. The received address is divided into a row address and a column address and then retained within the semiconductor storage device.

Referring now to the timing diagram of FIG. 3, it is assumed that an external read command is applied at time t1. At this time, a row address buffer circuit (not shown) latches an externally applied row address, and selects and activates a word line (not shown) within the memory cell array 102. The column address buffer circuit latches an externally applied column address, and outputs the column address as an internal column address signal. In a typical storage device that utilizes address multiplexing, initially the row address will be applied and latched. Subsequently, the column address will be applied and latched at the same time the read command is applied. The latched column address, as noted above, can represent the base address of a burst address sequence.

It is understood that the burst length and CAS latency can be initialized by a mode setting command.

Also at time t1, the application of the read command results in the activation of the READEN signal by a burst counter (not shown). Thus, the READEN signal is shown to go high shortly after time t1. The READEN signal maintained high, by the burst counter, for a "burst period" that is generally equivalent to the number of clock cycles in the burst sequence. Thus, because the access described by FIG. 3 is for a burst count of four, the burst period is shown to last for four ICLK signal periods following the initial application of the read command.

Furthermore, in order to accomplish the burst count, while the READEN signal is active, the column address buffer will initially generate the internal column base address of the burst sequence. The lower two bits of the internal column address will then be altered in a sequential fashion to generate a sequence of burst addresses. The burst address sequence will be generated in synchronism with the ICLK signal.

A row address decoder (not shown) will receive each latched row address from a row address buffer, and in response thereto, select a word line within the memory cell array 102. Each word line corresponds to a row of memory cells.

A column address decoder (not shown) will receive each internal column address, and in response thereto, select a digit line within the memory cell array 102. Each digit line corresponds to a column of memory cells, and will be connected to a sense amplifier resulting in data being read from or written into a memory cell of the column.

In this manner, the memory cells connected to a selected word line and selected digit line will be output to the RWBUS via associated sense amplifiers. The data corresponding to the base column address generated at time t1, is shown as DATA0 in the RWBUS waveform of FIG. 3.

The generation of data for the subsequent data sets of the burst sequence occurs in a similar fashion. Thus, in response to the second ICLK pulse following the application of the read command (the ICLK pulse at time t2), the second set of burst data (DATA1) are placed on the RWBUS. Similarly, in response to the third subsequent ICLK pulse (at time t3), the third set of the burst data (DATA2) are placed on the RWBUS. Subsequent data sets are output in a likewise fashion.

It is noted that, with respect to the base address of the data burst, the processing path from the memory cell array 102 to the input end of the signal delay device 104 is initiated only in response to the ICLK signal edge present when the read command is issued (the low-to-high transition in the ICLK signal at time t1). Thus, the processing path does not depend upon ICLK pulses occurring after time t1, and can be considered to function in an "asynchronous fashion."

In the same general fashion, the processing path operates in an asynchronous fashion for the remaining data sets of the burst sequence: The processing for the second data set (DATA1) occurring in response to the ICLK pulse at time t2, and not depending upon any subsequent ICLK pulses; the processing for the third data set (DATA2) occurring in response to the ICLK pulse at time t3, and not depending upon any subsequent ICLK pulses, etc.

In this way, the data accesses from (and to) the memory cell array 102 are performed independently of any CAS latency setting. At the same time, multiple sets of data can be processed within a certain time period (cycle time), forming a pipeline system.

The asynchronous processing path of the preferred embodiment 100 can provide advantages over conventional synchronous pipeline systems. For example, at higher internal clock frequencies, cases can arise in which a set of data (or address) values can arrive to a processing stage before the stage has completed processing a previous set of data (or address) values. As just one example, the internal column address may change from an initial column address to a subsequent column address at a time when the data set corresponding to the initial column address has not yet been established on a read/write bus. In such a case, a misoperation can occur.

In contrast, the preferred asynchronous approach, by operating processing stages independent of the ICLK signal, can avoid such misoperations, allowing operating frequencies to be increased.

The operation of the preferred embodiment 100 continues with data on the RWBUS being latched into the signal delay device 104 according to the input control signals (DSEL0 and DSEL1). When the FIFO 200 of FIG. 2 is employed, data will be latched within either the first register 202-0 or the second register 202-1. Which register (202-0 or 202-1) receives data is determined by the input control section 116.

Once data are latched within the signal delay device 104, the data will be output onto the OUT bus according to the OSEL0 and OSEL1 signals provided by the output control section 122. The data will then be received and output by the output buffer 106.

The control of the signal delay device 104 by the input control section 116 and output control section 122 will now be described in detail. The description assumes that the signal delay device 104 is the FIFO 200 of FIG. 2.

First, the delay circuit 108 delays the ICLK signal by a predetermined amount to output the ICLK1 signal. The delay circuit 108 serves to determine the timing for the latching of data read from memory cell array 102 into the FIFO 200. Thus, if the timing requirements are such that a delay is not necessary and/or inherent signal propagation delay is sufficient to establish the delay, the presence of delay circuit 108 may not be necessary.

Continuing with the description of the preferred embodiment 100 operation, when the READEN signal transitions high, the read synchronizing signal generator 110 outputs the ICLK1 signal as the YRD signal. At the same general time, logic gate 112 provides the OCNTCK signal as a logical product of the ICLK signal and READEN signal.

Within the input control section 116, the count delay circuit 118-0 delays the OCNT1 signal from counter 114 to generate the DCNT0 signal. At the same time, count delay circuit 118-1 delays the OCNT0 signal from counter 114 to generate the DCNT1 signal. Because the count delay circuits (118-0 and 118-1) serve to adjust the timing of the DCNT0 and DCNT1 signals, if the timing matches without the use of delay circuits, the count delay circuits (118-0 and 118-1) may not be necessary.

The latch circuit 120-0 latches the DCNT0 signal and outputs it as the DSEL0 signal in response to an active YRD signal pulse. In the same fashion, latch circuit 120-1 will latch the DCNT1 signal and outputs it as the DSEL1 signal in response to the active YRD signal.

In this manner, when the READEN signal is high, either the DESL0 or DSEL1 signal will be high in synchronism with the YRD signal. In particular, if the count value provided by counter 114 is a "0," the input control section 116 sets the DSEL0 and DSEL1 signals to a high and low level, respectively. If the count value is a "1," the DSEL0 and DSEL1 signals are set to a low and high level, respectively.

With the generation of the DSEL0 and DSEL1 signals, first transfer gate 204-0 will turn on or off, depending upon whether the DSEL0 signal is high or low, respectively. In addition, first transfer gate 204-1 will turn on or off, depending upon whether the DSEL1 signal is high or low, respectively.

In the particular access illustrated by FIG. 3, since the DSEL0 signal is high at time t2, first transfer gate 204-0 is turned on. In this way, a data bit resulting from the base address (DATA0) (that is output onto the RWBUS) is coupled to first transfer gate output RBUS0. The DATA0 value bit is thus stored within storage circuit 206-0 (and hence stored within first register 202-0).

Also at time t2, the DSEL1 signal is low, thus first transfer gate 204-1 is turned off. The logic at first transfer gate RBUS1 is thus indefinite.

At time t3, the next data set (DATA1) is placed on the RWBUS. However, the DSEL0 signal is low, resulting in first transfer gate 204-0 being turned off. Thus, the DATA0 value bit remains latched in storage circuit 206-0.

However, also at time t3, the DSEL1 signal is high, resulting in transfer gate 204-1 being turned on. The DATA1 value bit is coupled to first transfer gate output RBUS1, and stored within storage circuit 206-1. In this way, the second storage register 202-1 stores the DATA1 value bit.

In this manner, on the first clock cycle, a base address data bit is stored in one register 202-0, while a subsequent data bit value is stored with another register 202-1. This operation continues for a two stage FIFO, with alternate data bit values being coupled to registers in the counting cycle order. Thus, at time t4, a third data bit from the third consecutive data set (DATA2) is stored in the first register 202-0, while at time t5 a fourth data bit, from the fourth consecutive data set (DATA3) is stored in the second register 202-1.

As set forth in FIG. 3, after the initial data set (DATA0, the data set corresponding to the base address of the burst sequence) is stored within the FIFO 200, the OSEL0 and OSEL1 signals will begin to output data sets from the FIFO 200. This is accomplished in the first embodiment 100 by the output control section 122.

Within the output control section 122, output control logic gate 124-0 takes the logical product of the OCNT0 signal and the READEN signal to generate the OSEL0 signal. Output control logic gate 124-1 takes the logical product of the OCNT1 signal and the READEN signal to generate the OSEL1 signal. In this configuration, provided the READEN signal is active (high), either the OSEL0 or OSEL1 signal will be driven high in conjunction with a rising edge of the OCNTCK signal. In particular, if the count value is "0," the OSEL0 and OSEL1 signals are high and low, respectively. Conversely, if the count value is "1," the OSEL0 and OSEL1 signals are low and high, respectively. In response to the OSEL0 signal level, second transfer gate 208-0 will be turned on or off. Similarly, in response to the OSEL1 signal level, second transfer gate 208-1 will be turned off or on.

Referring once again to FIG. 3, following the latching of the DATA0 data by the first rising edge of the DSEL0 signal, data sets will begin to be output at about time t3. At time t3, since the OSEL0 signal is high, second transfer gate 208-0 will be turned on. As will be recalled, at this time, the DATA0 value bit is stored within storage circuit 206-0. Accordingly, as second transfer gate 208-0 is turned on, the DATA0 value bit will be output onto the OUT bus.

Also at time t3, the OSEL1 signal is low, resulting in second transfer gate 208-1 being turned off. In this way, any data values stored within the storage circuit 206-1 are isolated from the OUT bus. OSEL1 remains low as the DATA1 value bit is stored, preventing the DATA1 value bit from propagating through to the OUT bus.

At time t4, the OSEL0 signal goes low and the OSEL1 signal goes high. Second transfer gate 208-0 turns off and second transfer gate 208-1 turns on. The OSEL0 signal remains low, keeping second transfer gate 208-0 off, and preventing the DATA2 value bit from propagating to the OUT bus. With second transfer gate 208-1 turned on, the DATA1 value bit will be output onto the OUT bus.

Subsequently, at about time t5, the DATA2 value bit, that was previously stored within the first register 202-0, will be output onto the OUT bus.

The output buffer 106 receives the data values placed on the OUT bus, and outputs them to external connections (DQ) in synchronism with the ICLKOE signal. This results in data being output in synchronism with the ICLK signal.

If reference is made once again to FIG. 3, it is shown that following the application of the read command at time t1, the data corresponding to the base address of the burst sequence (DATA0) is output at time t4. Because the data is present three clock periods after the read command, FIG. 3 illustrates a CAS latency of three.

As described above, in a first embodiment 100 that employs the FIFO 200 as the signal delay device 104, the number of registers within the FIFO 200 is equal to the CAS latency minus one (two in this embodiment). However, to ensure correct data flow through the FIFO 200, one set of data must be input to a specific register in accordance with an input control signal (DSEL0 or DSEL1). At the same time, data sets must be output from the FIFO 200, after the appropriate latency, in accordance with an output control signal (OSEL0 or OSEL1).

Figure 4:
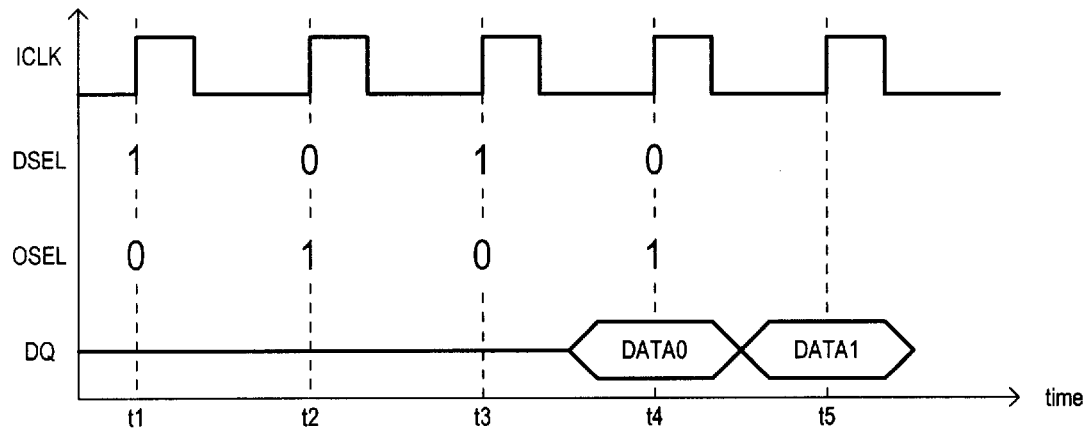
FIG. 4 is a timing diagram showing the relationship between FIFO input control signals and FIFO output control signals in the first embodiment.

As a result, the input control signals (DSEL0 or DSEL1) and output control signals (OSEL0 or OSEL1) must have a definite relationship to one another. This relationship is illustrated in a timing diagram in FIG. 4. The DSEL0 and DSEL1 signals are consolidated into a single representation DSEL. Thus, an active (high) DSEL signal represents data being loaded into the FIFO, while an active (high) OSEL signal represents data being output from the FIFO.

The proper relationship between the input control signals (referred to collectively as DSEL) and output control signals (referred to collectively as OSEL) is maintained by delaying the OCNT1 signal by count delay circuit 118-0 to generate the DSEL0 signal, and delaying the OCNT0 signal by count delay circuit 118-1 to generate the DSEL1 signal. In this configuration, following the activation of the READEN signal, the DSEL0 and DSEL1 are maintained in a defined relationship to the OSEL0 and OSEL1 signals, independent of internal synchronous timing signals, such as the ICLK signal and the like.

While the preferred embodiment 100 includes a counter 114 situated externally to the input control section 116 and the output control section 122, this arrangement should not be construed as limiting the invention to such a configuration.

As just one example, the input control section 116 and output control sections 122 could each include an associated counter to assure proper generation of the DSEL0, DSEL1, OSEL0 and OSEL1 signals. However, in such an arrangement, in the event a reset operation occurs, the count within each counter must be reset to proper values. For example, given a CAS latency of three, when a reset operation occurs, an input select signal (DSEL0 or DSEL1) must be set to an active state, while the corresponding output select signal (OSEL1 or OSEL0) must be set to an inactive state. Moreover, the two counters must be operated to maintain the relationship illustrated in FIG. 4. To prevent any deviation from the relationship of FIG. 4, the counters would have to be operated once a reset occurs, to bring them to the proper count value. This can require a more complex control circuit than that set forth in FIG. 1.

In contrast to the two counter approach described above, the preferred embodiment 100 single counter approach requires less area, resulting in a smaller overall chip size. In addition, because the preferred embodiment 100 maintains a constant relationship between the DSEL0/DSEL1 signals with respect to the OSEL0/OSEL1 signals, the input control section 116 and output control section 122 do not need to be operated at all times, and can be enabled only when the READEN signal is active. This can results in reduced standby current values.

The preferred embodiment 100 control arrangement of FIG. 1 ensures that a given set of data uses the same counter to both input the set of data and output the set of data, and can maintain proper data flow control. Thus, the preferred embodiment 100 arrangement does not require a reset circuit responsive to a read command, as would be the case in the two counter variation described above.

The timing diagram further illustrates how the first embodiment 100 can provide rapid access times. Given an appropriate reference clock (and hence ICLK) frequency and CAS latency, the timing of data arriving on the RWBUS will overlap with an active input control signal (DSEL0 or DSEL1) and output control signal (OSEL0 or OSEL1) for the same register. That is, with data on the RWBUS, either the DSEL0 and OSEL0 signals will both be high, or the DSEL1 and OSEL1 signals will both be high. At such a time, the data set on the RWBUS will simply pass through the FIFO 200 and on to the data buffer 106. Consequently, the overhead added to the synchronous data access path by the preferred FIFO arrangement is the delay introduced by data passing through the FIFO 200. Because such a delay is very short, the FIFO could be incorporated into existing arrangement without a large increase in access time.

After passing through the FIFO 200 in an initial read access, the data output from the FIFO 200 is output from the storage device by the output buffer 106. This data set is then available for use by other devices on the rising edge of ICLK signal at time t4, fulfilling the CAS latency requirement (of three in this example).

In this way, minimal circuits are used in the data path, allowing pipeline operation to take place, but at the same time adding little overhead to access speeds. High-speed read operations result.

It is also noted that in the first embodiment 100 arrangement, there is no need for a change in the pipeline boundary control in response to variations in CAS latency. The maximum frequency of internal synchronous clock signals (such as ICLK) for any CAS latency is the maximum frequency of the storage device memory cell array 102 (i.e., the DRAM "core" when the storage device is a SDRAM). In this way, the maximum burst transfer frequency can be increased. The preferred embodiment 100 arrangement also provides a simplified circuit arrangement, contributing to reduced chip area.

It is understood that the while the FIFO 200 of FIG. 2 utilizes cross-coupled inverters (210-0/210-1 and 212-0/212-1), this should not be construed as limiting the invention. As just a few examples, a "flip-flop" circuit or a data retention circuit that latches RWBUS data in response to input control signals (such as DSEL0/DSEL1) could be employed. Along these same lines, the particular first transfer gate arrangement of FIG. 2 should also not be construed as limiting to the invention. The logical product of an input control signal and an RBUS data value could provide an input value. Logical product circuits could also be used at the outputs of the FIFO 200 instead of the second transfer gate arrangement. AND and NAND gates are just two examples of logical product circuits that could be used.

Figure 5:
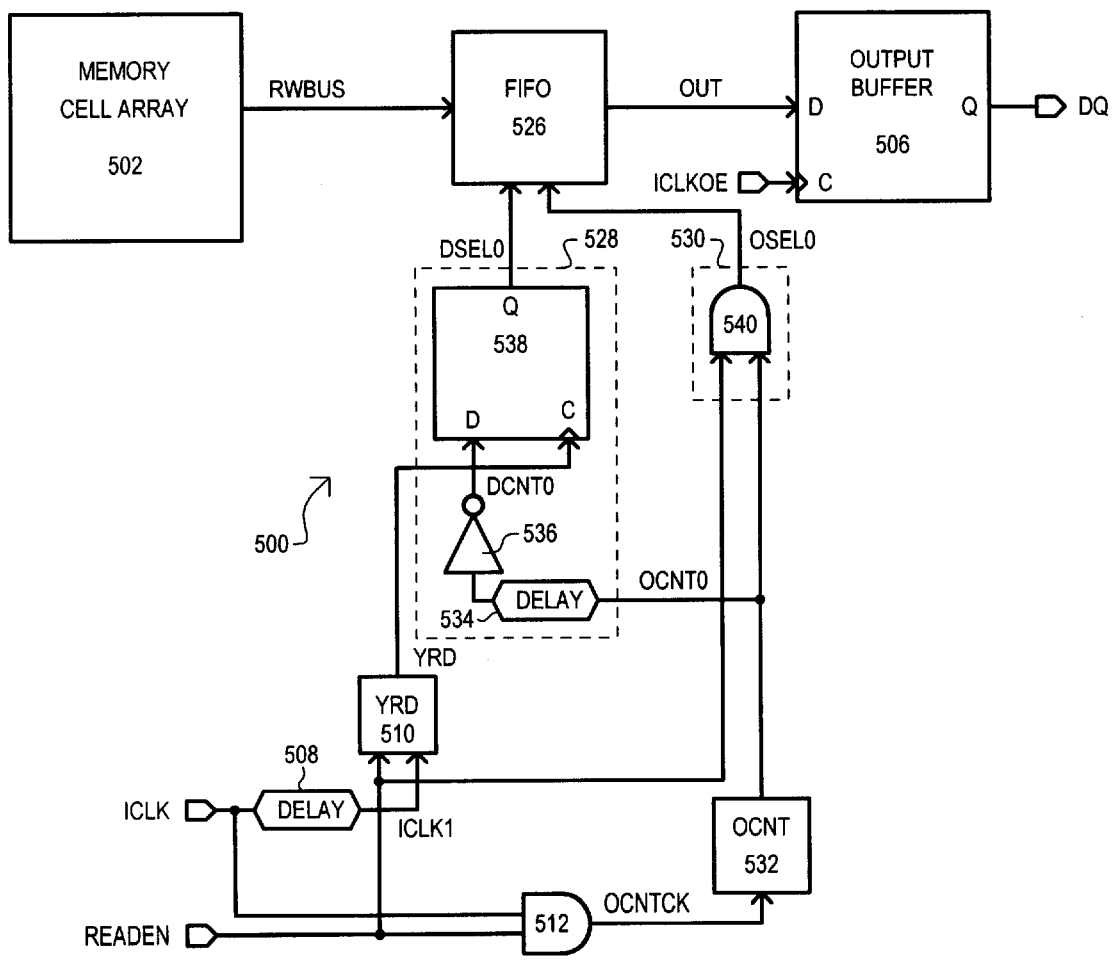
FIG. 5 is a block diagram of a semiconductor storage device showing a second embodiment of the present invention.
Figure 6:
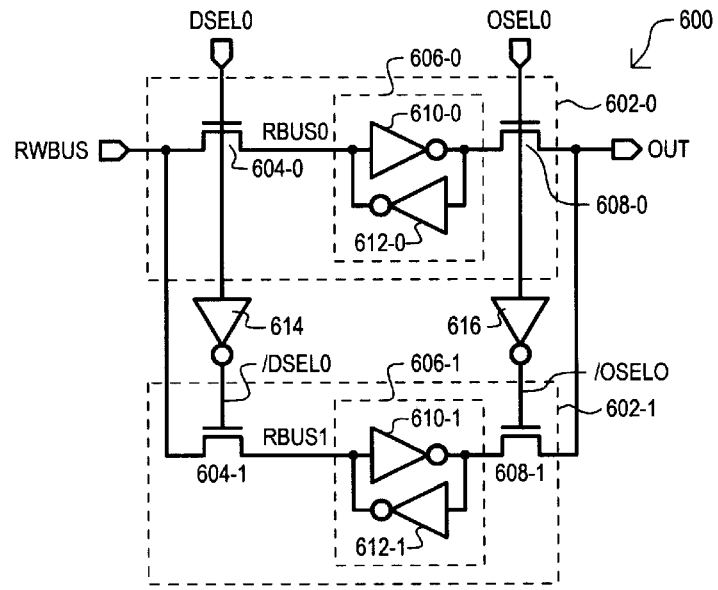
FIG. 6 is a schematic diagram illustrating a FIFO that may be used in the semiconductor storage device of FIG. 5.
Figure 7:
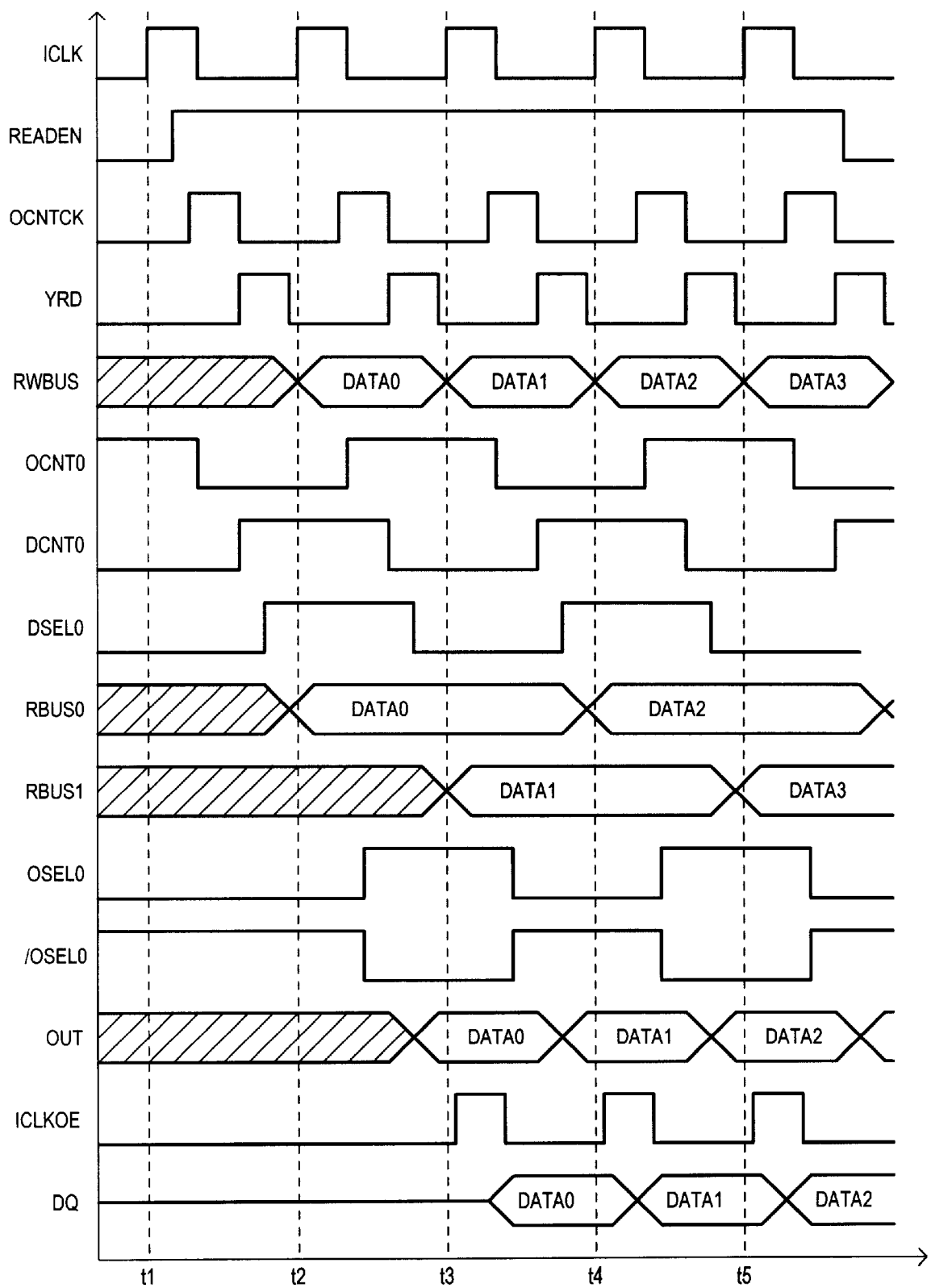
FIG. 7 is a timing diagram illustrating the operation of the semiconductor storage device of FIG. 5.

Referring now to FIGS. 5–7, a second embodiment of the present invention will be described in detail. FIG. 5 is a block diagram of a semiconductor storage device according to the second embodiment. FIG. 6 is a schematic diagram of a signal delay device that may be used in the second embodiment. FIG. 7 is a timing diagram illustrating the operation of the second embodiment.

Referring now to FIG. 5, the second embodiment is designated by the general reference character 500, and includes many of the same constituents as the first embodiment set forth in FIG. 1. To that extent, like constituents will be referred to by the same reference character, but with the first digit being a "5" instead of a "1."

Accordingly, the embodiment of FIG. 5 includes a memory cell array 502, an output buffer 506, a delay circuit 508, a read synchronizing signal generator 510, and a logic gate 512. In the second embodiment 500 read accesses to the memory cell array 502 occur in the same general fashion as the first embodiment 100, and result in data sets being placed on an RWBUS. Furthermore, the operation of the output buffer 506, delay circuit 508, read synchronizing signal generator 510, and logic gate 512 is essentially the same as that set forth in FIG. 1.

The second embodiment 500 differs from the first embodiment 100 in that it includes a signal delay device 526, input control section 528, output control section 530, and counter 532 that vary in operation from those of FIG. 1.

The signal delay device set forth in FIG. 6 is a FIFO, and is designated by the general reference character 600. For the purposes of this detailed description it is assumed that the FIFO 600 is utilized as the signal delay device 526 in FIG. 5.

Referring now to FIG. 6, the FIFO 600 is shown to include a number of registers (602-0 and 602-1). As in the case of the FIFO 200 of FIG. 2, the number of registers within FIFO 600 will be equal to a CAS latency value minus one. Therefore, because a CAS latency value of three is assumed, the FIFO 600 includes a first register 602-0 and a second register 602-1.

Like the operation of the FIFO 200, the registers (602-0 and 602-1) of the FIFO 600 are used in a cyclical fashion, generally synchronous to an internal synchronous clock signal (ICLK). Thus, register 602-0 would be accessed, followed by register 602-1, then the cycle would repeat itself once again with register 602-0 being accessed.

The registers (602-0 and 602-1) of FIG. 6 have the same general arrangement as the registers (202-0 and 202-1)) of FIG. 2. Accordingly, like constituents are referred to by the same reference character, but with the first digit being a "6" instead of a "2." The registers (602-0 and 602-1) are connected in parallel between an RWBUS input and an OUT bus output by first transfer gates (604-0 and 604-1) and second transfer gates (608-0 and 608-1), respectively.

Unlike the FIFO 200 of FIG. 2, the FIFO 600 does not latch RWBUS data in response to two input control signals. Instead, the FIFO 600 receives a single input control signal DSEL0. The DSEL0 signal is provided to the first register 602-0, and to the second register 602-1 by way of input control inverter 614. In a similar fashion, the FIFO 600 does not receive two output control signals, but instead has a single output control signal OSEL0, that is applied to the first register 602-0, and to the second register 602-1 by way of output control inverter 616.

Referring back to FIG. 5, the OCNTCK signal generated by the logic gate 512 is applied to counter 532. In synchronism with the OCNTCK signal, the counter 532 counts, in a cyclical fashion, a number that is equal to the number of registers within FIFO 600. In this embodiment, because the FIFO 600 includes two registers, the counter 532 would count 0, then 1, then 0, then 1, etc.

In the particular arrangement of FIG. 5, the counter 532 outputs a count prior to any decoding. Thus, because the signal delay device 526 (FIFO 600) includes two registers only a single output line from the counter 532 is required. If the number of registers were four, two output lines would be necessary. Three lines would be required for eight registers. Accordingly, if the number of registers within the signal delay device 526 is given as "m," the number of output lines would be given by $\log_2 m$. In this way, the amount of wiring for the counter 532 can be reduced, and hence the area required for wiring can be correspondingly reduced.

As shown in FIG. 5, the counter 532 provides a count signal OCNT0, which takes a logic high value when the count is "1" and a logic low level when the count is "0." It is understood that a count could begin with either "0" or "1."

The input control section 528 of the second embodiment 500 is shown to include a count delay circuit 534 that receives the OCNT0 signal and delays it by a predetermined amount. The resulting signal is inverted by a count inverter 536 to generate an input controlling count signal DCNT0. A latch circuit 538 receives the DCNT0 signal and the YRD signal. The latch circuit 538 latches the DCNT0 signal in response to the rising edge of the YRD signal to generate the input control signal DSEL0 for the signal delay circuit 526.

The output control section 530 is shown to include output control logic gate 540. The output control logic gate 540 takes the logical product of the OCNT0 signal and the READEN signal to generate the OSEL0 signal.

Having described the general constituents of the second embodiment 500, the operation of the input control section 528 and output control section 530 will now be described.

Within the input control section 528, count delay circuit 534 receives the OCNT0 signal, and delays it to provide an input to count inverter 536. The count inverter 536 provides the DCNT0 signal as an output to the latch circuit 538.

The latch circuit 538 latches the DCNT0 signal on the rising edge of the YRD signal to supply the DSEL0 signal to FIFO 600.

In this way, if the READEN signal is active (high, in this example), the DSEL0 signal will output a value of 0, then 1, then 0, etc., in synchronism with the rising edge of the YRD signal.

In particular, in response to a counter 532 value of "0" or "1," the input control section 528 will provide a DSEL0 signal having a high and low level, respectively.

Referring to FIG. 6, first transfer gate 604-0 within FIFO 600 will be turned on or off, in response to the DSEL0 signal being high or low, respectively. In a similar fashion, due to the operation of input control inverter 614, first transfer gate 604-1 within FIFO 600 will be on or off, in response to the DSEL0 signal being low or high, respectively.

Referring to FIG. 7, the operation of the FIFO 600 is reflected in the timing diagram. In particular, at time t2, since the DSEL0 signal is high, first transfer gate 604-0 is turned on. Consequently, a bit from data set DATA0 is stored within storage circuit 606-0. At the same time, because the /DSEL0 signal (the output of input control inverter 614) is low, first transfer gate 604-1 is turned off, isolating storage circuit 606-1 from the RWBUS. Thus, the value at the output of first transfer gate 604-1 (RBUS1) remains indefinite at time t2.

At time t3, the DSEL0 signal goes low. As a result, first transfer gate 604-0 is turned off, isolating the storage circuit 606-0 from the RWBUS. In this way, the DATA0 bit remains latched within storage circuit 606-0. At the same time, the /DSEL0 signal goes high, resulting in first transfer gate 604-1 being turned on. As a result, a bit from a subsequent data set DATA1 is stored in storage circuit 606-1.

In a similar fashion, at time t4, a bit from a third data set DATA2 is stored in storage circuit 606-0, and at time t5, a bit from a fourth data set DATA3 is stored in storage circuit 606-1.

As will be recalled, within the output control section 530, the output control logic gate 540 takes the logical product of the OCNT0 signal and the READEN signal to generate the OSEL0 signal. In such a configuration, if the READEN signal is active, the OSEL0 signal will have a value of 0, then 1, then 0, etc., in synchronism with the rising edge of the OCNTCK signal.

In particular, if the counter 532 count value is 0, the OSEL0 signal is low. Conversely, when the count value is 1, the OSEL0 signal is high.

Within the FIFO 600, in response to high and low levels in the OSEL0 signal, the second transfer gate 608-0 is turned on and off, respectively. Conversely, when the OSEL0 signal is high and low, second transfer gate 608-1 is turned off and on, respectively.

Referring once again to FIG. 7, the operation of the FIFO 600 in providing data to the OUT bus is reflected in the timing diagram. In particular, at time t3, since the OSEL0 signal is high, second transfer gate 608-0 is turned on. The DATA0 bit, that was previously stored within the storage circuit 606-0, is thus coupled to the OUT bus. At the same time, because the /OSEL0 signal (the output of output control inverter 616) is low, second transfer gate 608-1 is turned off, and the DATA1 bit stored within storage circuit 606-1 is isolated from the OUTbus.

At time t4, the OSEL0 signal goes low. As a result, second transfer gate 608-0 is turned off, isolating the storage circuit 606-0 from the OUT bus. At the same time, the /OSEL0 signal goes high, resulting in second transfer gate 608-1 being turned on. In this way, the next data bit in the burst sequence (the DATA1 value bit), that was previously stored within the storage circuit 606-1, is coupled to the OUT bus.

In a similar fashion, at time t5, a bit from the third data set DATA2, stored within storage circuit 606-0, will be output onto the OUT bus.

It is noted that in the second embodiment 500, the count value provided by counter 532 is not decoded within the counter (as it is in the first embodiment), and is essentially decoded by the input and output control inverters (614 and 616) within the FIFO 600. In this way, the second embodiment 500 operates in a similar fashion to the first embodiment 100, but advantageously simplifies the circuitry of the input control section and the output control section. Consequently, less area is required for these sections than is required in the first embodiment 100. An overall smaller chip size can thus be achieved.

Figure 9:
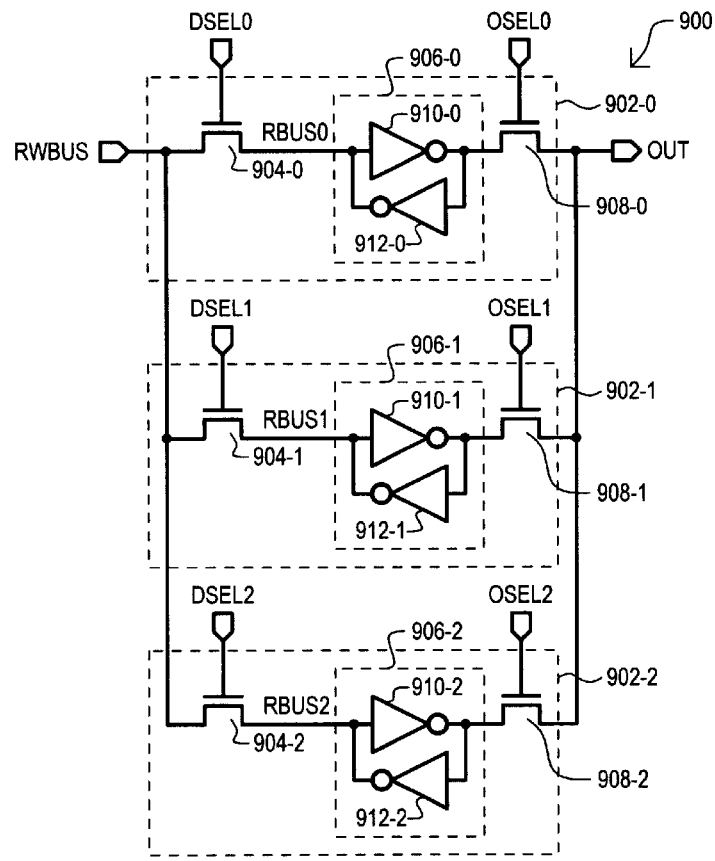
FIG. 9 is a schematic diagram illustrating a FIFO that may be used in the semiconductor storage device of FIG. 8.
Figure 8:
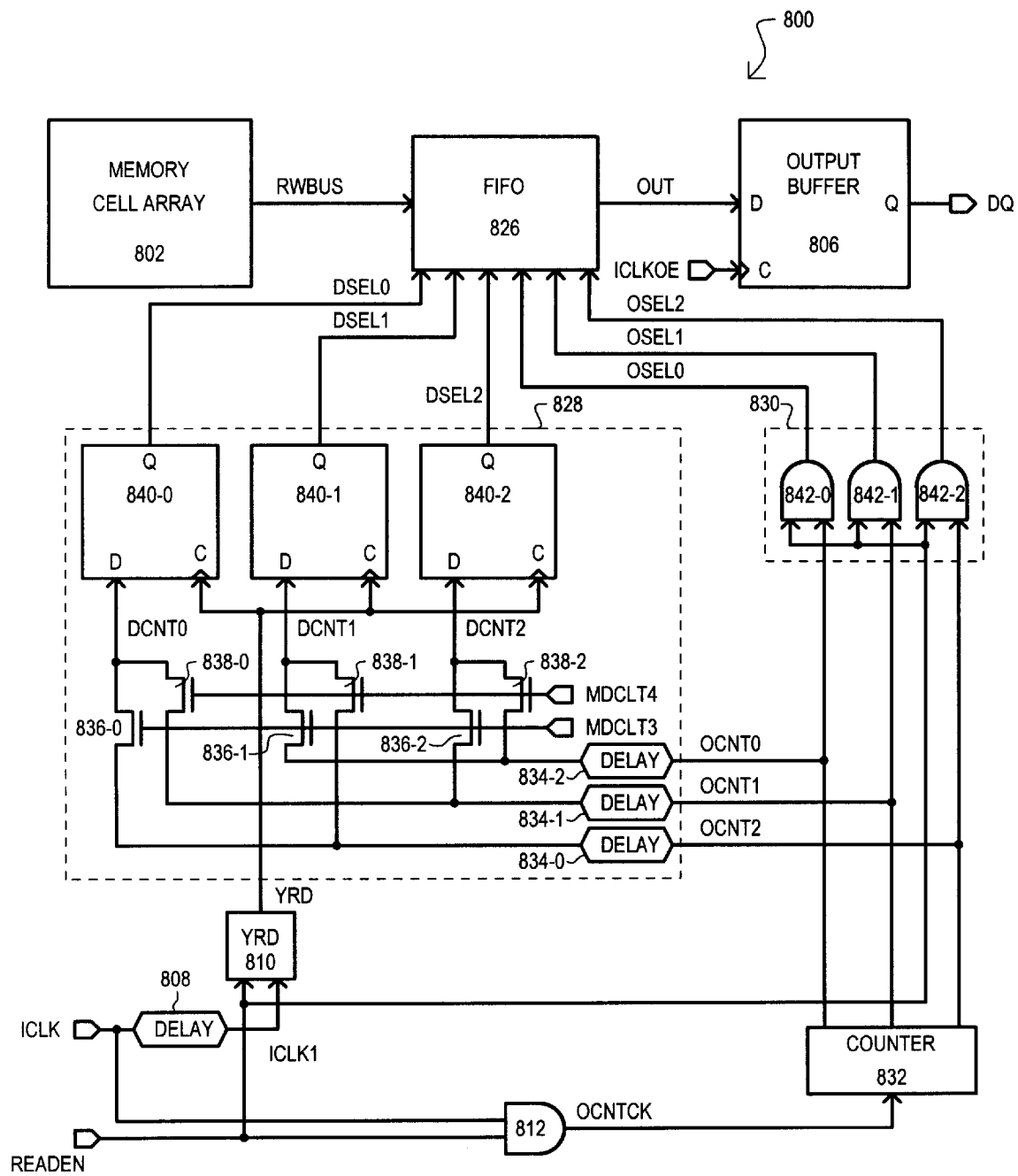
FIG. 8 is a block diagram of a semiconductor storage device showing a third embodiment of the present invention.
Figure 10:
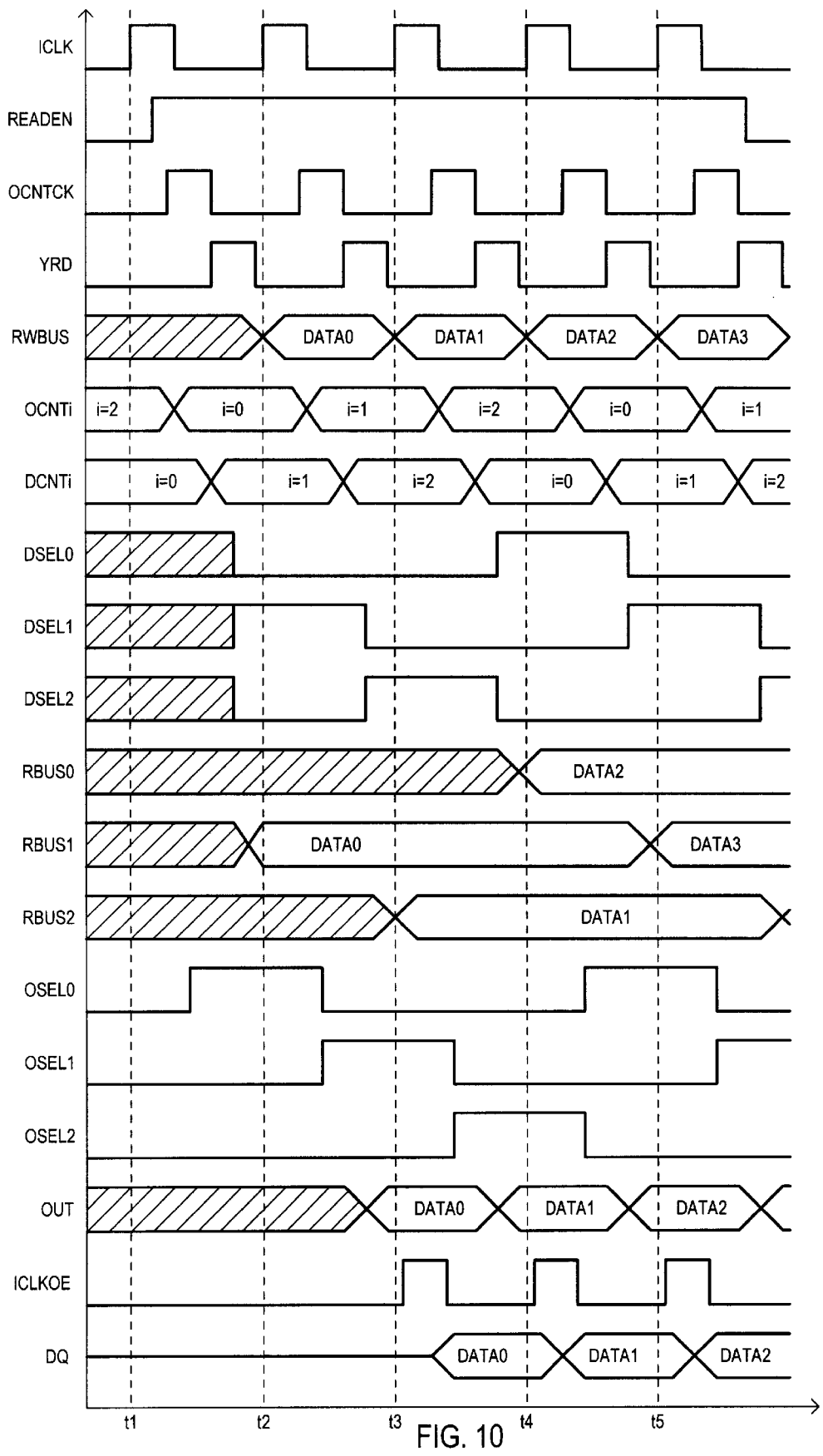
FIG. 10 is a timing diagram illustrating the operation of the semiconductor storage device of FIG. 8 for a CAS latency of "3".
Figure 11:
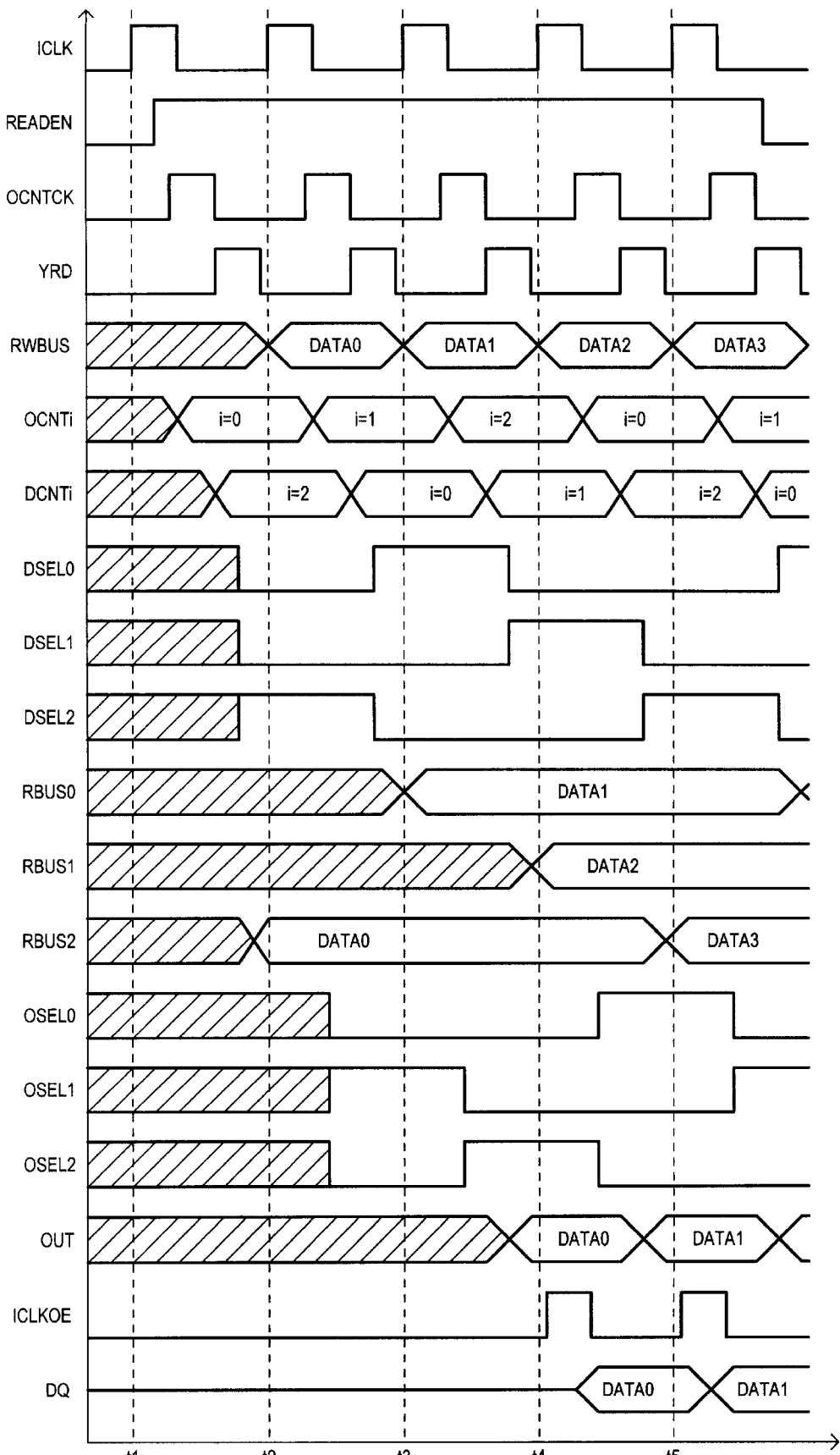
FIG. 11 is a timing diagram illustrating the operation of the semiconductor storage device of FIG. 8 for a CAS latency of "4".

Referring now to FIGS. 8–11, a third embodiment will be described in detail. FIG. 8 is a block diagram of a semiconductor storage device according to the third embodiment. FIG. 9 is a schematic diagram of a signal delay device that may be used in the third embodiment. FIG. 10 is a timing diagram illustrating the operation of the third embodiment with a CAS latency of "3." FIG. 11 is a timing diagram illustrating the operation of the third embodiment with a CAS latency of "4." Thus, while the first and second embodiments (100 and 500) illustrate CAS latencies that are fixed at three, the third embodiment allows a CAS latency to be selected between 3 and 4.

Referring now to FIG. 8, the third embodiment is designated by the general reference character 800, and includes many of the same constituents as the first embodiment set forth in FIG. 1. To that extent, like constituents will be referred to by the same reference character, but with the first digit being an "8" instead of a "1."

Accordingly, the embodiment of FIG. 8 includes a memory cell array 802, an output buffer 806, a delay circuit 808, a read synchronizing signal generator 810, and a logic gate 812. In the second embodiment 800 read accesses to the memory cell array 802 occur in the same general fashion as the first embodiment 100, and result in data sets being placed on an RWBUS. In addition, the operation of the output buffer 806, delay circuit 808, read synchronizing signal generator 810, and logic gate 812 is essentially the same as that set forth in FIG. 1.

The third embodiment 800 differs from the first embodiment 100 in that it includes a signal delay device 826, an input control section 828, an output control section 830, and a counter 832 that vary in operation from those of FIG. 1.

The signal delay device set forth in FIG. 9 is a FIFO, and is designated by the general reference character 900. For the purposes of this detailed description it is assumed that the FIFO 900 is utilized as the signal delay device 826 in FIG. 8.

The particular FIFO 900 set forth in FIG. 9 is shown to include a number of registers that is equal to the maximum CAS latency possible minus one (in this case, three).

Like the operation of the FIFO 200, the registers (902-0 to 902-2) of the FIFO 900 are used in a cyclical fashion, generally synchronous to an internal synchronous clock signal (ICLK). Thus, in operation, register 902-0 would be accessed, followed by register 902-1, followed by register 902-2. The cycle would then repeat once again with register 902-0 being accessed.

The registers (902-0 to 902-2) of FIG. 9 have the same general arrangement as the registers (202-0 and 202-1) of FIG. 2. Accordingly, like constituents are referred to by the same reference character, but with the first digit being a "9" instead of a "2." The registers (902-0 to 902-2) are connected in parallel between an RWBUS input and an OUT bus output by first transfer gates (904-0 to 904-2) and second transfer gates (908-0 to 908-2), respectively.

Unlike the FIFO 200 of FIG. 2, because the FIFO 900 includes a third register 902-2, the FIFO 900 receives a third input control signal DSEL2, in addition to the first two input control signals DSEL0 and DSEL1. The DSEL2 signal controls first transfer gate 904-2 within third register 902-2. Likewise, the FIFO 900 also receives a third output control signal OSEL2, in addition to two other output control signals OSEL0 and OSEL1. The OSEL2 signal controls second transfer gate 908-2 within third register 902-2.

Referring back to FIG. 9, in synchronism with the OCNTLK signal, the counter 832 counts, in a cyclical fashion, a number that is equal to the number of registers within FIFO 900. In this embodiment, because the FIFO 900 includes three registers, the counter 832 counts 0, then 1, then 2, then 0, then 1, etc. Furthermore, like the counter 114 of the first embodiment 100, the counter 832 decodes the count value into three count signals, OCNT0–OCNT2. In this arrangement, at any given time in a count sequence, only one of the count flu, signals (OCNT0–OCNT2) will be high, while the remaining two count signals will be low.

The input control section 828 of the third embodiment 800 is shown to include three count delay circuits 834-0 to 834-2. Each count delay circuit (834-0 to 834-2) receives one of the count signals (OCNT0–OCNT2), and delays it by a predetermined amount. The input control section 828 further includes a first set of transfer gates 836-0 to 836-2.

In the particular arrangement of FIG. 8, the transfer gates are n-channel IGFETs. Transfer gate 836-0 has a source-drain path coupled to the output of count delay circuit 834-0, transfer gate 836-1 has a source-drain path coupled to the output of count delay circuit 834-2, transfer gate 836-2 has a source-drain path coupled to the output of count delay circuit 834-1. The first set of transfer gates (836-0 and 836-2) is commonly controlled by a "latency-3" enable signal MDCLT3 applied to their control inputs (gates).

The input control section 828 of the third embodiment 800 is shown to further include a second set of transfer gates 838-0 to 838-2. In the particular arrangement of FIG. 8, the transfer gates of the second set are n-channel IGFETs. Transfer gate 838-0 has a source-drain path coupled to the output of count delay circuit 834-1, transfer gate 838-1 has a source-drain path coupled to the output of count delay circuit 834-0, transfer gate 838-2 has a source-drain path coupled to the output of count delay circuit 834-2. The second set of transfer gates (838-0 and 838-2) is commonly controlled by a "latency-4" enable signal MDCLT4 applied to their control inputs (gates).

The source-drain paths of transfer gates 836-0 and 838-0 are coupled together to provide an input controlling count signal DCNT0. Similarly, transfer gates 836-1 and 838-1 are coupled together to provide an input controlling count signal DCNT1, and transfer gates 836-2 and 838-2 are coupled together to provide an input controlling count signal DCNT2.

Three latch circuits 840-0 to 840-2 are also included within the input control section 828. Latch circuit 840-0 latches the DCNT0 signal in response to a rising edge of a YRD signal from the read synchronous signal generator 810. This results in the generation of the input control signal DSEL0. In a similar fashion, latch circuits 840-1 and 840-2 latch the DCNT1 and DCNT2 signals, respectively, in response to a rising edge of the YRD signal to generate input control signals DSEL1 and DSEL2, respectively.

The first set of transfer gates (836-0 to 836-2) and second set of transfer gates (838-0 to 838-2) serve as a switch circuit, allowing a switch between a CAS latency of 3 and a CAS latency of 4. The switching is controlled by the MDCLT3 and MDCLT4 signals, which may be generated by a control device, such as a central processing unit (CPU) within a computer system.

The output control section 830 is shown to include three output control logic gates 842-0 to 842-2. Output control logic gate 842-0 takes the logical product of the OCNT0 signal and the READEN signal to generate the OSEL0 signal. In the same fashion, the output control logic gates 842-1 and 842-2 take the logical product of the READEN signal and the OCNT1 and OCNT2 signals, respectively, to generate the OSEL1 and OSEL2 signals, respectively.

Having described the general constituents of the third embodiment 800, the operation of the input control section 828 and output control section 830 will now be described for an operation having a CAS latency of three.

As one example of a counter 832 operation, as the counter 832 counts values of 0, 1 and 2, the OCNT0 signal will have levels of high, low and low, respectively. The OCNT1 signal will have levels of low, high and low. The OCNT2 signal will have levels of low, low and high. These count values are collectively indicated by the waveform OCNTi of FIG. 10, which indicates only that signal which is high (i.e., a value of i=0 indicates the count signal OCNT0 is high).

Within the input control section 828, the count delay circuits (834-0 to 834-2) receive the OCNT0 to OCNT2 signals, and delay them by predetermined amounts.

For a CAS latency 3 case, the MDCLT3 signal will be active (high), resulting in the transfer gates of the first set (836-0 to 836-2) being turned on. When the MDCLT3 signal is inactive (low), transfer gates (836-0 to 836-2) will be turned off.

For a CAS latency 4 case, the MDCLT4 signal will be active (high), resulting in the transfer gates of the second set (838-0 to 838-2) being turned on. When the MDCLT4 signal is inactive (low), transfer gates (838-0 to 838-2) will be turned off.

Accordingly, for the CAS latency 3 operation illustrated in FIG. 10, the first set of transfer gates (836-0 to 836-2) is turned on and the second set of transfer gates (838-0 to 838-2) is turned off. In this configuration, the output of count delay circuit 834-0 becomes the DCNT0 signal, the output of count delay circuit 834-2 becomes the DCNT1 signal, and the output of count delay circuit 834-1 becomes the DCNT2 signal.

It is noted that, like the OCNTi waveform of FIG. 10, the input controlling count signals (DCNT0 to DCNT2) are collectively indicated by the waveform DCNTi of FIG. 10.

The DCNTi waveform indicates only the one signal which is high for a given count (i.e., a value of i=0 indicates the count signal DCNT0 is high).

Latch circuit 840-0 latches the DCNT0 signal on the rising edge of the YRD signal to generate the DSEL0 waveform shown in FIG. 10. In the same general fashion, latch circuit 840-1 latches the DCNT1 signal on the rising edge of the YRD signal to generate the DSEL1 waveform shown in FIG. 10, and latch circuit 840-2 latches the DCNT2 signal on the rising edge of the YRD signal to generate the DSEL2 waveform shown in FIG. 10.

In this way, if the READEN signal is active (high, in this example), the input control section 828 outputs a high level for a selected input control signal in the sequence of DSEL0, DSEL1, DSEL2, and DSEL0. . . . synchronously with the rising edge of the YRD signal.

In particular, in response to the counter values of "0," "1" and "2," the input control section 828 will provide a DSEL0 signal having the values of low, low and high, a DSEL1 signal having the values high, low and low, and a DSEL2 signal having values of low, high and low, respectively.

Referring now to FIG. 9, within the FIFO 900, first transfer gate 904-0 will be turned on or off in response to the DSEL0 signal being high or low, respectively. In a similar fashion, first transfer gate 904-1 will be turned on or off in response to the DSEL1 signal being high or low, respectively, and first transfer gate 904-2 will be turned on or off in response to the DSEL2 signal being high or low, respectively.

Referring to FIG. 10, the operation of the FIFO 900 for a CAS latency 3 operation is reflected in the timing diagram. In particular, at time t2, since the DSEL0 signal is low, first transfer gate 904-0 is turned off, isolating storage circuit 906-0 from the RWBUS. Consequently, as shown in FIG. 10, the output of first transfer gate 904-0 (RBUS0) will remain in an indefinite state.

In contrast, also at time t2, the DSEL1 signal is high, resulting in first transfer gate 904-1 being turned on. Consequently, a bit from data set DATA0 (the first data set of the burst sequence) is coupled to the output of first transfer gate 904-1 (RBUS1). The DATA0 bit is thus stored within storage circuit 906-1.

Also at time t2, the DSEL2 signal is low, turning off first transfer gate 904-2. This isolates storage circuit 906-2 from the RWBUS. Consequently, as shown in FIG. 10, the output of first transfer gate 904-2 (RBUS2) will remain in an indefinite state.

At time t3, the counting operation proceeds with the DSEL0 signal remaining low. As a result, first transfer gate 904-0 remains turned off, and storage circuit 906-0 continues to be isolated from the RWBUS. This prevents a bit from the second data set (DATA1) from being stored in the first register 902-0.

Also at time t3, the DSEL1 signal goes low, turning off first transfer gate 904-1. Consequently, the storage circuit 906-1 is isolated from the RWBUS, preventing the DATA1 value bit from being stored in storage circuit 906-1, which continues to store the DATA0 value bit.

Also at time t3, the DSEL2 signal goes high, turning on first transfer gate 904-2. Consequently, a bit from the DATA1 value (the second data set of the burst sequence) is coupled to the output of first transfer gate 904-2 (RBUS2). The DATA1 bit is thus stored within storage circuit 906-2.

In a similar fashion, at time t4, a bit from a third data set DATA2 is stored in storage circuit 906-0, and at time t5, a bit from a fourth data set DATA3 is stored in storage circuit 906-1.

As will be recalled, within the output control section 830, the output control logic gates (842-0 to 842-2) takes the logical products of the OCNT0–OCNT2 signals and the READEN signal, to generate the OSEL0–OSEL2 signal. In such a configuration, if the READEN signal is active, the output control section 830 will sequentially output high values for the signals OSEL0, OSEL1, OSEL2, OSEL0, OSEL1 . . . in synchronism with the rising edge of the signal OCNTCK.

In particular, in response to the count values 0, 1 and 2 from counter 832, the output control section 830 provides an OSEL0 signal having values of high, low and low, an OSEL1 signal having values low, high, and low, and an OSEL2 signal having values of low, low and high, respectively.

Within the FIFO 900, in response to high and low levels in the OSEL0 signal, second transfer gate 908-0 is turned on and off, respectively. In the same general fashion, in response to high and low levels in the OSEL1 signal, second transfer gate 908-1 is turned on and off, respectively, and in response to high and low levels in the OSEL2 signal, second transfer gate 908-2 is turned on and off, respectively.

Referring once again to FIG. 10 in conjunction with FIG. 9, the corresponding data output of the FIFO 900 will be described. Thus, at time t3, since the OSEL0 signal is low, second transfer gate 908-0 is turned off. Consequently, the indefinite value stored within storage circuit 906-0 is not output to the OUT bus.

In contrast, at the same time, because the OSEL1 signal is high, second transfer gate 908-1 is turned on. Consequently, the DATA0 value bit stored within storage circuit 906-1 output onto the OUT bus.

Also at time t3, since the OSEL2 signal is low, second transfer gate 908-2 is turned off. Consequently, the DATA1 value stored within storage circuit 906-2 is not output to the OUT bus.

At time t4, the OSEL0 signal remains low, keeping second transfer gate 908-0 turned off. Consequently, the DATA2 value bit stored within storage circuit 906-0 is not output to the OUT bus.

Also at time t4, the OSEL1 signal is low and second transfer gate 908-1 is turned off. Consequently, the DATA0 value bit stored within storage circuit 906-1 is no longer output onto the OUT bus.

In contrast, also at time t4, the OSEL2 signal is high. Second transfer gate 908-2 is turned on. Consequently, the DATA1 value stored within storage circuit 906-2 is output onto the OUT bus.

In a similar fashion, at time t5, a bit from the third data set DATA2, stored within storage circuit 906-0, will be output onto the OUT bus.

Having described the operation of the third embodiment 800 and FIFO 900 for a CAS latency of three, the operation of the third embodiment 800 and FIFO 900 for a CAS latency of four will now be described.

For a CAS latency of four, the MDCLT3 signal will be inactive, while the MDCLT4 signal is active. This results in the second transfer gate set (838-0 to 838-2) being turned on and the first set of transfer gates (836-0 to 836-2) is turned off. In this configuration, the output of count delay circuit 834-0 becomes the DCNT1 signal, the output of count delay circuit 834-1 becomes the DCNT0 signal, and the output of count delay circuit 834-2 becomes the DCNT2 signal.

As in the case of FIG. 10, the OCNT0–OCNT2 values are consolidated into a single waveform OCNTi, and the DCNT0–DCNT2 values are consolidated into a single waveform DCNTi.

In addition, as in the CAS latency three case, the latch circuit 840-0 latches the DCNT0 signal on the rising edge of the YRD signal. This generates the DSEL0 signal. At the same time, latch circuits 840-1 and 840-2 latch the DCNT1 and DCNT2 signals on the rising edge of the YRD signal. This results in the generation of the DSEL1 and DSEL2 signals.

In this way, if the READEN signal is active, the input control section 828 will output a high level for a selected input control signal in the sequence of DSEL0, DSEL1, DSEL2, and DSEL0 . . . synchronously with the rising edge of the YRD signal.

Referring now to FIG. 11, the operation of the FIFO 900 for a CAS latency 4 operation is reflected in the timing diagram. In particular, at time t2, since the DSEL0 signal is low, first transfer gate 904-0 is turned off, isolating storage circuit 906-0 from the RWBUS. Consequently, as shown in FIG. 11, the output of first transfer gate 904-0 (RBUS0) will remain in an indefinite state.

Similarly, the DSEL1 signal is also low at time t2, resulting in first transfer gate 904-1 being turned off. Consequently, like the first register 902-0, the output of first transfer gate 904-1 (RBUS1) will remain in an indefinite state.

In contrast, at time t2 the DSEL2 signal is high, causing transfer gate 904-2 to turn on. As a result, as shown in FIG. 11, a data bit from the first data set (DATA0) is stored within storage circuit 906-2. The output of first transfer gate 904-2 (RBUS2) will thus store the DATA0 value bit.

At time t3, the counting operation proceeds with the DSEL0 signal being high. As a result, first transfer gate 904-0 turns on, resulting in a data bit from a second data set (DATA1) being stored in storage circuit 906-0. Consequently, the output of first transfer gate 904-0 (RBUS0) will thus store the DATA1 value bit.

Also at time t3, the DSEL1 signal remains low, keeping first transfer gate 904-1 turned off. Consequently, the storage circuit 906-1 continues to be isolated from the RWBUS, preventing the DATA1 value bit from being stored in storage circuit 906-1.

Also at time t3, the DSEL2 signal goes low, turning off first transfer gate 904-2. In this way the storage circuit 906-2 is isolated from the RWBUS allowing the DATA0 value to remain stored within storage circuit 906-2.

In a similar fashion, at time t4, a bit from a third data set DATA2 is stored in storage circuit 906-1, and at time t5, a bit from a fourth data set DATA3 is stored in storage circuit 906-2.

Referring once again to FIG. 11 in conjunction with FIG. 9, the corresponding data output of the FIFO 900 will be described for the CAS latency 4 case.

At time t3, since the OSEL0 signal is low, second transfer gate 908-0 is turned off. Consequently, the DATA1 value stored within storage circuit 906-0 is not output to the OUT bus.

In contrast, at the same time, because the OSEL1 signal is high, second transfer gate 908-1 is turned on. Consequently, the value stored within storage circuit 906-1 output onto the OUT bus. It is noted that this is "invalid" indefinite data, as its timing does not corresponding to expected data.

Also at time t3, since the OSEL2 signal is low, second transfer gate 908-2 is turned off. Consequently, the DATA0 value stored within storage circuit 906-2 is not output to the OUT bus.

At time t4, the OSEL0 signal remains low, keeping second transfer gate 908-0 turned off. Consequently, the DATA1 value stored within storage circuit 906-0 is not output to the OUT bus.

Also at time t4, the OSEL1 signal is low once again, resulting in second transfer gate 908-1 being turned off once again. Consequently, the DATA2 value bit stored within storage circuit 906-1 is not output onto the OUT bus.

In contrast, also at time t4, the OSEL2 signal is high, causing second transfer gate 908-2 to be turned on. Consequently, the DATA0 value stored within storage circuit 906-2 is output onto the OUT bus.

In a similar fashion, at time t5, the DATA1 value stored within storage circuit 906-0 will be output onto the OUT bus.

In this way, a CAS latency 4 operation is accomplished by the third embodiment.

Figure 12:
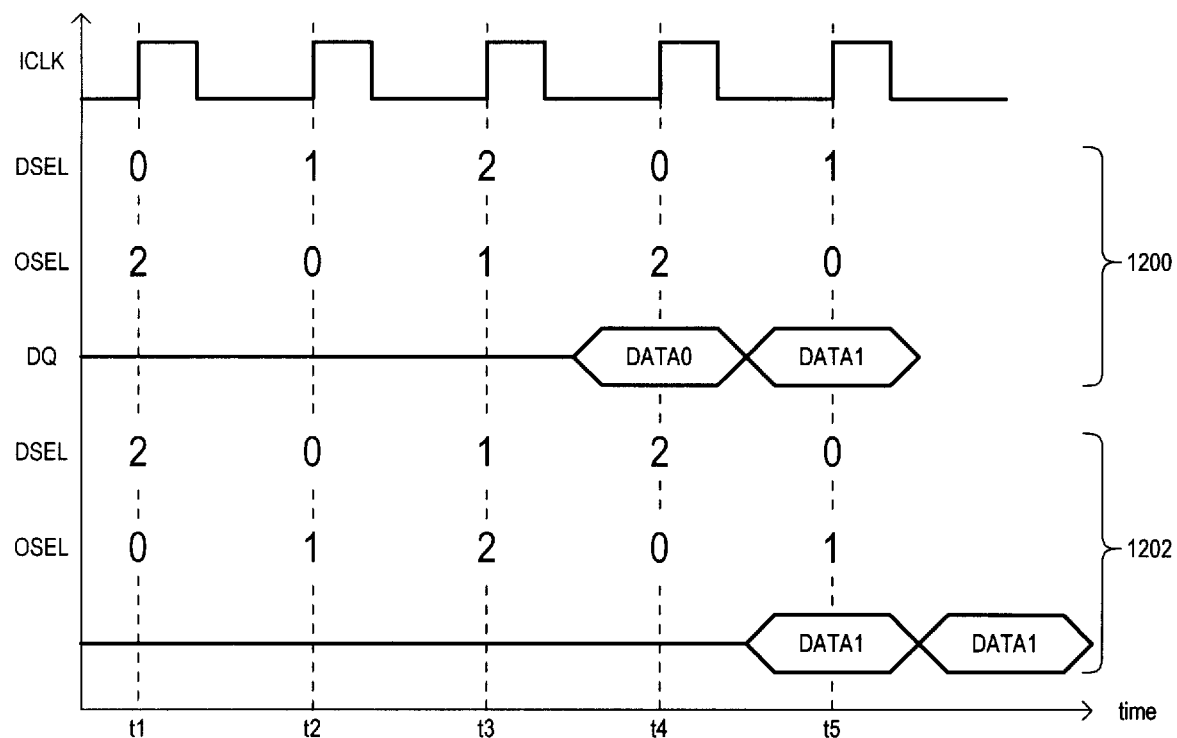
FIG. 12 is a timing diagram showing the relationship between FIFO input control signals and FIFO output control signals in the third embodiment, for both a CAS latency of "3" and a CAS latency of "4" according to the third embodiment.
Figure 13:
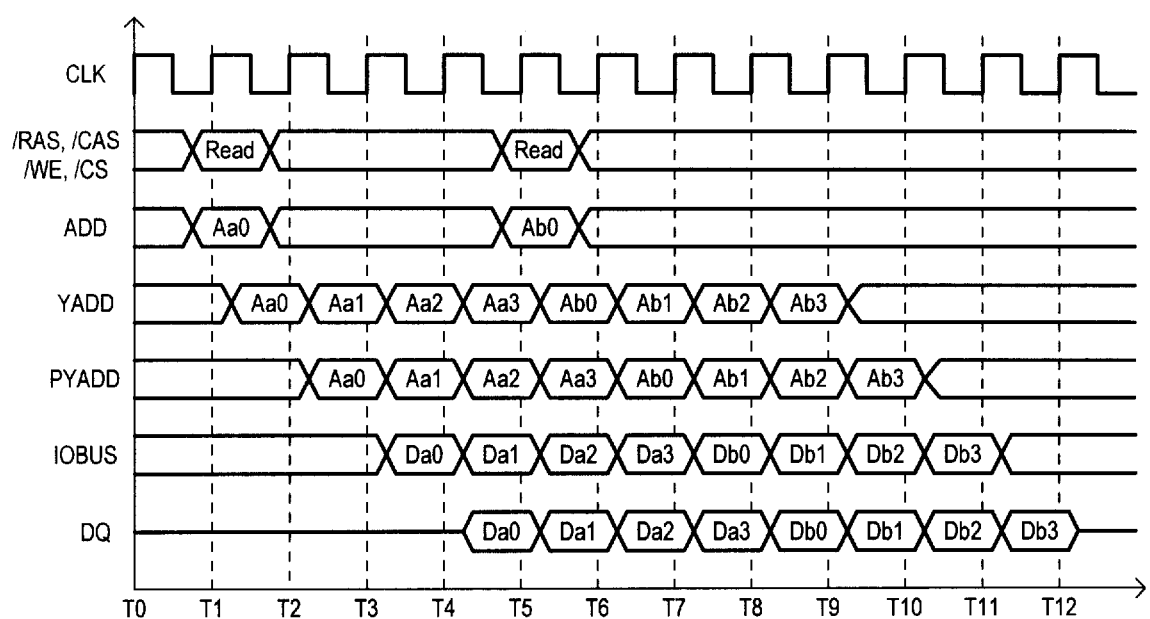
FIG. 13 is a timing diagram illustrating the readout operation of a conventional pipeline system.
Figure 14:
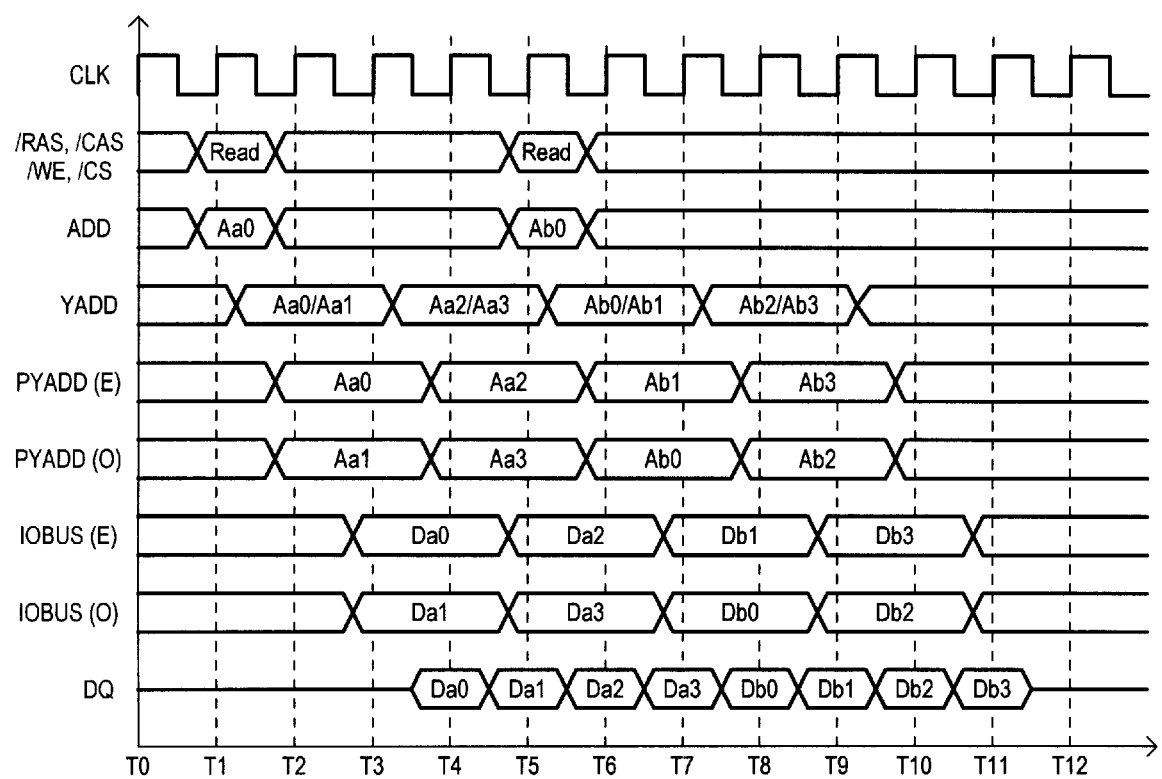
FIG. 14 is a timing diagram illustrating the readout operation of a conventional prefetch system.

The third embodiment 800 includes input control signals (DSEL0–DSEL2) and output control signals (OSEL0–OSEL2) that differ from those of the first embodiment 100. These differences are illustrated in a timing diagram in FIG. 12. The timing diagram includes the ICLK signal, and two sets of timing signals. A first set of timing signals 1200 illustrates a CAS latency of three, and a second set of timing signals 1202 illustrates a CAS latency of four.

Both sets of timing signals include a DSEL, OSEL and DQ waveform. The DSEL waveform is a consolidated waveform that indicates which of the DSEL0–DSEL2 signals is active at a given time. Similarly, the OSEL waveform is a consolidated waveform that indicates which of the OSEL0–OSEL2 signals is active at a given time. The DQ waveform indicates which data set is output from the storage device.

In the case of the CAS latency three operation 1200, the desired latency is achieved by establishing appropriate timing between the DSEL signals and the OSEL signals.

As will be recalled, in the particular embodiment of FIG. 8, proper timing between the DSEL and OSEL signals is accomplished by delaying the OCNT2 signal with the count delay circuit 834-0, and applying the delayed signal, via transfer gate 836-0, to the latch 840-0, thereby generating the DSEL0 signal. The OCNT0 signal is delayed by count delay circuit 834-2, and the delayed signal applied, via transfer gate 836-1, to the latch 840-1. This generates the DSEL1 signal. The OCNT1 signal is delayed by count delay circuit 834-1, and the delayed signal applied, via transfer gate 836-2, to the latch 840-2. This generates the DSEL2 signal.

In this way, the input buffer control signals (DSEL) and output buffer control signals (OSEL) are delayed by one clock cycle. Thus, the buffer circuits (840-0 to 840-2) in combination with an active MDCLT3 signal function as a delay device that provides output control signals by delaying input control signals by one clock cycle.

In the case of the CAS latency four case, proper timing between the DSEL and OSEL signals is accomplished by delaying the OCNT2 signal with the count delay circuit 834-0, and applying the delayed signal, via transfer gate 838-1, to the latch 840-1, thereby generating the DSEL1 signal. The OCNT1 signal is delayed by count delay circuit 834-1, and the delayed signal applied, via transfer gate 838-0, to the latch 840-0. This generates the DSEL0 signal. The OCNT0 signal is delayed by count delay circuit 834-2, and the delayed signal applied, via transfer gate 838-2, to the latch 840-2. This generates the DSEL2 signal.

In this way, the input buffer control signals (DSEL) and output buffer control signals (OSEL) are delayed by two clock cycles. Thus, the buffer circuits (840-0 to 840-2) in combination with an active MDCLT4 signal function as a delay device that provides output control signals by delaying input control signals by two clock cycles.

In this manner, the timing relationship between the DSEL and OSEL signals is kept constant, independent of the frequency of the reference clock and related synchronous signals (such as the ICLK signal). This can lead to the same speed advantages as the first embodiment. However, the third embodiment provides advantages over the first and second embodiments by allowing the CAS latency to be selectable between the values of three and four.

It is understood that while the third embodiment implements latency switching with the first and second sets of transfer gates (836-0 to 836-2 and 838-0 to 838-2), this should not be construed as limiting to the present invention. As just one example, the same function could be implemented at various locations between counter 832 and the signal delay device 826. This includes locations between the counter 832 and the output control section 830, or between the output control section 830 and the signal delay device 826. It is only necessary that a definite time interval be introduced between the activation of the DSEL signals and the activation of their corresponding OSEL signals.

Furthermore, it is understood that various constituents of the input control section 828 can be subject to variation. As just a few examples, the latches (840-0 to 840-2) could be replaced by logic circuits, such as AND gates, that receive the CNTO–CNT2 signals and YRD signal as inputs. Similarly, it is noted that the count delay circuits (834-0 to 834-2) are provided to adjust the timing for the latching of data provided by the memory cell array 802. Therefore, if the timing is adjusted at the output of the memory cell array 802, the count delay circuit (834-0 to 834-2) may not be required.

It is also noted that while one particular arrangement for the first and second transfer gate sets (836-0 to 836-2 and 838-0 to 838-2) is set forth in FIG. 8, this should not be construed as limiting. As just a few examples, instead of single n-channel IGFETs, transfer gates using complementary transistors could be employed. In such a case, each n-channel IGFET would include a p-channel IGFET arranged in parallel, with the gate of the n-channel IGFET being connected to the gate of the p-channel IGFET by an inverter. Alternatively, AND gates can be employed in the place of the transfer gates, with the inputs to the AND gate being a delayed count signal (i.e., an output from a count delay circuit) and a latency enable signal (i.e., MDCLT3 or MDCLT4).

By utilizing a signal delay devices that include a number of data registers arranged in parallel, with the data values being input to and output from the registers by input and output control signals, increases in CAS latency do not require increases in the number of stages within an access path. This is in contrast to a conventional pipeline system. This allows the present invention to provide rapid operating speeds.

In addition, the teachings set forth herein illustrate a semiconductor storage device having a high-speed burst mode, with very little additional gate delay, that can be implemented with little increase in chip area. Such a semiconductor storage device includes a data read circuit, a signal delay device, a counter, an input control section and an output control section.

Furthermore, the third embodiment illustrates how advantageous CAS latency switching can be accomplished by providing an input control section having a plurality of delay circuits, a plurality of latch circuits, and a switching circuit situated between the delay circuits and the latch circuits.

Reduced standby current can also result from the preferred embodiments. By utilizing an input control section with read clocking circuits, and an output control section with logical product circuits, the input and output control sections will operate only during a readout operation, reducing current in a standby mode of operation.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A signal delay device that receives data signals from a storage circuit and outputs the signals to an output circuit, the signal delay device comprising:

a signal generator that provides a plurality of output timing signals that are generated by decoding a count value; and a plurality of data registers connected in parallel, each data register having an input that is controlled by a corresponding input control signal, and an output that is controlled by a corresponding output control signal, the input and output control signals for the data registers being generated in response to the output timing signals of the signal generator.

2. The signal delay device of claim 1, wherein:

each data register receives input data at an input terminal and provides output data at an output terminal, each data register comprising, a storage circuit, a first transfer gate having an input coupled to the input terminal, an output coupled to the storage circuit, and a control terminal coupled to an input control signal, and a second transfer gate having an input coupled to the storage circuit, an output coupled to the output terminal, and a control terminal coupled to an output control signal.

3. The signal delay device of claim 2, wherein:

each storage circuit includes a first inverter having an input coupled to the output of the first transfer gate, and an output coupled to the input of the second transfer gate, and a second inverter having an input coupled to the output of the first inverter, and an output coupled to the output of the first transfer gate.

4. The signal delay device of claim 1, wherein:

each data register receives input data at an input terminal and provides output data at an output terminal, each data register comprising, a flip-flop circuit having an input coupled to the input terminal and a clock terminal coupled to an input control signal, the flip-flop circuit storing input data in synchronism with the input control signal, and a second transfer gate having an input coupled to an output of the flip-flop circuit, an output coupled to the output terminal, and a control terminal coupled to the output control signal.

5. The signal delay device of claim 1, wherein:

the signal generator circuit includes
- a counter that counts a clock signal to generate count values, and
- a decoder that decodes the count value to generate count signals.

6. The signal delay device of claim 1, wherein:

the signal generator circuit includes a counter that counts a clock signal to generates a binary count value, the binary count value being decoded into an input control signal and an output control signal.

7. The signal delay device of claim 6, further including:

a decoder having an input inverter that receives the input control signal as an input, and an output inverter that receives the output control signal as an input; and the plurality of registers includes a first data register and a second data register, the first data register receiving a the input control signal and a the output control signal, the second data register receiving the input control signal by way of the input inverter and the output control signal by way of the output inverter.

8. The signal delay device of claim 1, wherein:

the activation of the input control signals and output control signals occur at predetermined time periods apart from one another according to delay elements that delay input control signals with respect to output control signals.

9. The signal delay device of claim 8, further including:

a counter that provides count values as a number of different decode outputs; and the predetermined time period is provided by generating the input control signal and output control signal corresponding to the same data register in response to different decode outputs.

10. The signal delay device of claim 8, further including:

means for selecting the predetermined time period.

11. The signal delay device of claim 10, further including:

a counter that provides count values as a number of different decode outputs;

the input control signals and output control signals are generated in response to the decode outputs; and the means for selecting the predetermined time period includes a plurality of switch networks for providing the decode outputs from the counter.

12. A semiconductor storage device, comprising:

a memory cell array that provides at least one data value in response to external input signals;

a signal delay device having a plurality of data registers, each data register including a data input controlled by an input control signal and a data output controlled by an output control signal, the data registers being connected in parallel for temporarily storing data values provided by the memory cell array;

a counter that generates at least one count signal based upon counting a count reference clock;

an input control section for generating input control signals based upon the at least one count signal, the input control signal for a given data value being activated in response to a first edge type of the reference clock; and an output control section for generating output control signals based upon the at least one count signal, the output control signal for the given data value being activated in response to a second edge type of the reference clock, the second edge type being different from the first edge type.

13. The semiconductor storage device of claim 12, further including:

the memory cell array outputting data values in response to edges of the reference clock; and an output buffer having a buffer input coupled to the data output of the signal delay device, the output buffer outputting stored data values from the signal delay device in response to edges of the reference clock, the reference clock edge that results in the output of a given data value from the memory cell array being different from the reference clock edge that results in the output of the given data value from the output buffer.

14. The semiconductor storage device of claim 13, wherein:

a predetermined number of clock periods passes between the reference clock that results in the output of a data value from the memory cell array and the reference clock that results in the output of the data value from the output buffer; and the number of data registers within the signal delay device is equal to the predetermined number.

15. The semiconductor storage device of claim 12, wherein:

each storage register includes
- a storage circuit,
- a first transfer gate having an input coupled to a signal input terminal, an output coupled to the storage circuit, and a control terminal coupled to an input control signal, and
- a second transfer gate having an input coupled to the storage circuit, an output coupled to an output terminal, and a control terminal coupled to an output control signal.

16. The signal delay device of claim 15, wherein:

each storage circuit includes
- a first inverter having an input coupled to the output of the first transfer gate, and an output coupled to the input of the second transfer gate, and
- a second inverter having an input coupled to the output of the first inverter, and an output coupled to the output of the first transfer gate.

17. The semiconductor storage device of claim 12, further including:

means for decoding a count signal disposed between the signal delay device and the input control section and output control section.

18. The semiconductor storage device of claim 17, wherein:

the signal delay device includes a first data register and a second data register, the first data register receiving a given input control signal and given output control signal; and the means for decoding includes
- an input inverter having an inverter input that that receives the given input control signal and an inverter output coupled to the second data register, and
- an output inverter having an inverter input that that receives the given output control signal and an inverter output coupled to the second data register.

19. The semiconductor storage device of claim 12, wherein:

the counter has a number of states equal to the number of data registers within the signal delay device, the counter changing states in response to a counter reference clock, the states being expressed as a counter output that includes a plurality of count signals;

the input control section comprising a plurality of delay circuits that delay each of the count signals, and a plurality of latch circuits that latch the outputs of the delay circuits in response to a read clock signal to thereby generate input control signals; and the output control section generates output control signals in response to the count signals.

20. The semiconductor storage device of claim 19, further including:

a read clock generating circuit that generates a read clock signal during a read period in response to the reference clock;

a logical product circuit for taking a logical product of the reference clock and an enable signal to generate the counter reference clock; and the output control section taking the logical product of the enable signal and the counter output to generate the output control signals.

21. The semiconductor storage device of claim 12, wherein:

the counter has a number of states equal to the number of data registers within the signal delay device, the counter changing states in response to a counter reference clock, the states being expressed as a counter output that includes a count signal;

the input control section comprising a delay circuit having a delay circuit input and a delay circuit output, the delay circuit delaying the count signal, a latch circuit that latches the output of the delay circuit in response to a read clock signal to thereby generate an input control signal; and the output control section generates output control signals from the count signal.

22. The semiconductor storage device of claim 12, further wherein:

the counter has a number of states equal to the number of data registers within the signal delay device, the counter changing states in response to a counter reference clock, the states being expressed as a counter output that includes a plurality of count signals;

the input control section comprising a plurality of delay circuits that delay each of the count signals, a plurality of latch circuits that latch the outputs of the delay circuits in response to a read clock signal to thereby generate input control signals, and a switch circuit disposed between the delay circuits and the latch circuits, the switch circuit controlling the connection between the outputs of the delay circuits and the plurality of latch circuits; and the output control generates output control signals in response to the count signals.

23. A semiconductor memory device, comprising:

a memory cell array having a plurality of memory cells, the memory cell array providing at least one data value;

a data bus including at least one bus line for each data value provided by the memory cell array;

a signal delay device coupled to the data bus, the signal delay device including an input terminal and associated output terminal corresponding to each bus line, the signal delay device further including a plurality of storage registers arranged in parallel between each input terminal and its associated output terminal;

a counter circuit that generates a plurality of decoded count signal in response to a count clock signal.

24. The semiconductor memory device of claim 23, wherein:

the signal delay device is a first-in-first-out buffer (FIFO) that inputs data values from each input terminal in a predetermined order, and outputs data values from each output terminal in the predetermined order.

25. The semiconductor memory device of claim 23, wherein:

each storage register includes a storage circuit.

26. The semiconductor memory device of claim 25, wherein:

each storage register further includes a first input gate disposed between its input terminal and storage circuit.

27. The semiconductor memory device of claim 25, wherein:

each storage register further includes an output gate disposed between its storage circuit and output terminal.

28. The semiconductor memory device of claim 23, further including:

the data registers storing data values from the data bus in response to input control signals, and outputting data values in response to output control signals; and an input control section that includes a delay circuit corresponding to each count signal, each delay circuit delaying a count signal to generate an input control signal.

29. The semiconductor memory device of claim 28, further including:

an output control section that generates output control signals in response to each count signal.

30. The semiconductor memory device of claim 28, wherein:

the input control section includes a plurality of switch circuits, each switch circuit enabling a different combination of count signals to be used to generate input control signals.

* * * * *